(12) United States Patent
Jones et al.

(10) Patent No.: US 9,367,517 B2
(45) Date of Patent: Jun. 14, 2016

(54) INTEGRATED CIRCUIT PACKAGE WITH MULTIPLE DIES AND QUEUE ALLOCATION

(75) Inventors: Andrew Michael Jones, Bristol (GB); Stuart Ryan, Bristol (GB)

(73) Assignee: STMicroelectronics (Research & Development) Limited, Marlow, Buckinghamshire (GB)

( * ) Notice: Subject to any disclaimer, the term of this patent is extended or adjusted under 35 U.S.C. 154(b) by 1577 days.

(21) Appl. No.: 12/958,744

(22) Filed: Dec. 2, 2010

(65) Prior Publication Data

US 2011/0133826 A1    Jun. 9, 2011

(30) Foreign Application Priority Data

Dec. 7, 2009    (EP) .................................... 09178185

(51) Int. Cl.
*G06F 15/78*    (2006.01)
*H04L 12/933*    (2013.01)

(52) U.S. Cl.
CPC .............. *G06F 15/78* (2013.01); *H04L 49/109* (2013.01); *H01L 2224/16225* (2013.01); *H01L 2924/15311* (2013.01); *H04L 49/101* (2013.01); *Y02B 60/1207* (2013.01); *Y02B 60/1225* (2013.01)

(58) Field of Classification Search
CPC ..... G06F 15/78; H04L 49/109; H04L 49/101; Y02B 60/1225; Y02B 60/1207
See application file for complete search history.

(56) References Cited

U.S. PATENT DOCUMENTS 6,009,488 A * 12/1999 Kavipurapu .................. 710/105
6,219,744 B1    4/2001 Bredin et al.
6,425,054 B1    7/2002 Nguyen
6,460,105 B1    10/2002 Jones et al.
6,526,501 B2    2/2003 Edwards et al.
6,571,308 B1    5/2003 Reiss et al.
6,895,447 B2    5/2005 Brewer et al.
7,024,502 B2    4/2006 Horowitz et al.
7,155,556 B2    12/2006 Kim et al.
7,579,683 B1 *  8/2009 Falik et al. ..................... 257/690
7,679,177 B2 *  3/2010 Jang .............................. 257/686
7,689,748 B2    3/2010 Grossman et al.
7,958,283 B2    6/2011 Islam et al.

(Continued)

FOREIGN PATENT DOCUMENTS

EP    1303100 A2    4/2003
EP    1598744 A1    11/2005

(Continued)

OTHER PUBLICATIONS

Wikipedia: "Quality of Service," Dec. 2, 2009 (9 pages).

(Continued)

*Primary Examiner* — William Coleman
(74) *Attorney, Agent, or Firm* — Gardere Wynne Sewell LLP

(57) ABSTRACT

A package includes a first die and a second die. The dies are connected to each other through an interface. At least one of the first and second dies includes a plurality of signal sources, wherein each source has at least one quality of service parameter associated therewith, and a plurality of queues having a different priorities. A signal from a respective one of the signal sources is allocated to one of the plurality of queues in dependence on the at least one quality of service parameter associated with the respective signal source. The interface is configured such that signals from said queues are transported from one of said first and second dies to the other of said first and second dies.

26 Claims, 14 Drawing Sheets

(56) References Cited

U.S. PATENT DOCUMENTS

| | | | |
|---|---|---|---|
| 7,966,648 B2 * | 6/2011 | Park | H04W 28/24 709/223 |
| 8,174,530 B2 * | 5/2012 | Stuttard et al. | 345/505 |
| 8,176,492 B2 | 5/2012 | Manoj et al. | |
| 8,189,328 B2 | 5/2012 | Kanapathippillai et al. | |
| 8,451,879 B2 * | 5/2013 | Kennedy et al. | 375/130 |
| 8,504,751 B2 * | 8/2013 | Jones et al. | 710/260 |
| 8,610,258 B2 | 12/2013 | Jones et al. | |
| 8,629,544 B2 | 1/2014 | Jones et al. | |
| 8,698,321 B2 * | 4/2014 | Suh | 257/777 |
| 8,761,174 B2 * | 6/2014 | Jing et al. | 370/392 |
| 2002/0097733 A1 | 7/2002 | Yamamoto | |
| 2003/0097502 A1 | 5/2003 | Bacigalupo | |
| 2003/0101320 A1 * | 5/2003 | Chauvel | G06F 12/0888 711/154 |
| 2003/0151134 A1 | 8/2003 | Nishizawa et al. | |
| 2004/0088460 A1 | 5/2004 | Poisner | |
| 2004/0125103 A1 * | 7/2004 | Kaufman et al. | 345/419 |
| 2004/0252689 A1 | 12/2004 | Park et al. | |
| 2005/0154812 A1 | 7/2005 | DeWitt et al. | |
| 2006/0077730 A1 | 4/2006 | Jakobs et al. | |
| 2006/0095621 A1 | 5/2006 | Vinogradov et al. | |
| 2006/0136570 A1 * | 6/2006 | Pandya | 709/217 |
| 2006/0164150 A1 | 7/2006 | Asano | |
| 2006/0190655 A1 | 8/2006 | Kautzman et al. | |
| 2007/0002760 A1 | 1/2007 | Tiruvallur et al. | |
| 2007/0136537 A1 * | 6/2007 | Doblar et al. | 711/154 |
| 2007/0157048 A1 | 7/2007 | Levin et al. | |
| 2007/0260796 A1 | 11/2007 | Grossman et al. | |
| 2007/0299992 A1 | 12/2007 | Imada | |
| 2008/0098418 A1 * | 4/2008 | Dabrowa et al. | 725/25 |
| 2008/0144411 A1 | 6/2008 | Tsern | |
| 2008/0244209 A1 * | 10/2008 | Seelam et al. | 711/168 |
| 2008/0273527 A1 | 11/2008 | Short et al. | |
| 2008/0310391 A1 * | 12/2008 | Schneidman | H04L 47/10 370/349 |
| 2009/0079066 A1 | 3/2009 | Jang | |
| 2010/0281308 A1 | 11/2010 | Xu et al. | |

FOREIGN PATENT DOCUMENTS

| | | | |
|---|---|---|---|
| EP | 1688847 A1 | 8/2006 | |
| GB | 2339035 A | 1/2000 | |
| JP | 59058565 A | 4/1984 | |
| WO | WO-9910814 A1 | 3/1999 | |
| WO | WO-2005043838 A1 | 5/2005 | |
| WO | WO-2005071556 A1 | 8/2005 | |
| WO | WO-2007139893 A2 | 12/2007 | |
| WO | WO-2008000059 A1 | 1/2008 | |
| WO | WO-2008042403 A2 | 4/2008 | |
| WO | WO-2008076790 A2 | 6/2008 | |

OTHER PUBLICATIONS

Ankur Agarwal, Cyril Iskander, Ravi Shankar, "Survey of Network on Chip (NoC) Architectures & Contributions," Journal of Engineering, Computing and Architecture, ISSN 1934-7197, vol. 3, Issue 1, 2009, XP002573800, 15 total pages.

Dobkin (Reuven) Rostislav, Victoria Vishnyakov, Eyal Friedman, Ran Ginosar, "An Asynchronous Router for Multiple Service Levels Networks on Chip," VLSI Systems Research Center, Technion—Israel Institute of Technology, Haifa 32000, Israel, Proceedings of the 11th IEEE International Symposium on Asynchronous Circuits and Systems (ASYNC'05), 10 total pages.

Dr. Antoni Ferre, Mr. Joan Fontanilles, "Devices and Microsystems in the Automotive Industry," Lear Automotive EEDS Spain St., European Tech. Center, Pusters 54 E43800 Valls, pp. 19-22.

Dr. Robert C. Pfahl, Jr., iNEMI, Joe Adam, Skyworks, "System in Package Technology," iNEMI—International Electronics Manufacturing Initiative, 25 total pages.

English Translation Abstract for JP 59058565 published on Apr. 4, 1984.

EPO Search Report mailed Mar. 31, 2010 for EP 09178185.6.

King L. Tai, "System-In-Package (SIP): Challenges and Opportunities," Bell Laboratories, Lucent Technologies, Murray Hill, NJ, copyright 2000 IEEE, pp. 191-196.

Martin Goetz, "System on Chip Design Methodology Applied to System in Package Architecture," Alpine Microsystems, Dallas, TX 75225, 2002 Electronic Components and Technology Conference, pp. 254-258.

Se-Joong Lee, Kangmin Lee, Seong-Jun Song, and Hoi-Jun Yoo, "Packet-Switched On-Chip Interconnection Network for System-On-Chip Applications," IEEE Transactions on Circuits and Systems—II: Express Briefs, vol. 52 No. 6, Jun. 2005, pp. 308-312.

* cited by examiner

INTEGRATED CIRCUIT PACKAGE WITH MULTIPLE DIES AND QUEUE ALLOCATION

PRIORITY CLAIM

This application claims priority from European Patent Application 09178185.6 filed Dec. 7, 2009, the disclosure of which is hereby incorporated by reference.

TECHNICAL FIELD

The present invention relates to a package comprising a first die and a second die.

BACKGROUND

An ongoing trend is for the feature size in silicon technology to decrease. For example, decreasing feature sizes in CMOS (complementary metal-oxide-semiconductor) silicon processing allows digital logic to shrink in each successive fabrication technology. For example, if a digital logic cell is implemented with 90 nm (nanometer) technology, that same cell would take 55% less area if implemented with 65 nm technology.

SUMMARY

According to one aspect, there is provided a package comprising: a first die; a second die; and an interface connecting said first die and said second die, at least one of said first and second dies comprising: a plurality of signal sources, each of said signal sources having at least one quality of service parameter associated therewith, a plurality of queues, said queues having different priorities; and means for allocating a signal from a respective one of said signal sources to one of said plurality of queues in dependence on the at least one quality of service parameter associated with the respective signal source; wherein the interface is configured such that signals from said queues are transported from one of said first and second dies to the other of said first and second dies.

According to another aspect, there is provided a die for use in a package comprising a die and at least one further die, said die comprising: a plurality of signal sources, each of said signal sources having at least one quality of service parameter associated therewith, a plurality of queues, said queues having different priorities; means for allocating a signal from a respective one of said signal sources to one of said plurality of queues in dependence on the at least one quality of service parameter associated with the respective signal source; and an interface between said die and said further die wherein the interface is configured such that signals from said queues are transported from said dies to the further die.

According to another aspect, there is provided a method for use in a package comprising a first die and a second die, said method comprising: providing a plurality of signal sources, each of said signal sources having at least one quality of service parameter associated therewith; providing a plurality of queues, said queues having different priorities; allocating a signal from a respective one of said signal sources to one of said plurality of queues in dependence on the at least one quality of service parameter associated with the respective signal source; and transporting said signals from said queues across an interface, between said first and second dies.

One or more of the above described aspects may, but not necessarily, address or mitigate one or more of the following problems.

It has been appreciated by the inventors that the analog and IO (input/output) cells may shrink less, if at all, as compared to digital cells, when the size of the nanometer technology is reduced. This may lead to a situation that for more complex systems on an integrated circuit, the design is increasingly pad limited. A pad limited design may be disadvantageous in that the digital logic may not be implemented as densely as it might be where the digital logic is the determining factor in the device area.

A further problem has been identified by the inventors. For example, the transition to smaller designs, such as to below 32 nanometers, introduces a dichotomy between supporting low voltage, high speed input/output logic as well as higher voltage interconnect technologies. One example of low voltage, high speed input/output logic may, for example be a DDR3 SDRAM (double-data-rate 3 synchronous dynamic random access memory). This may require a voltage of 1.5V. By way of example only, higher voltage interconnect technology may be HDMI (high definition multimedia interface), SATA (serial advance technology attachment) or USB3 (universal serial bus 3). For example, a lower voltage DDR3 interface may require a transistor gate oxide having a thickness of 30 Angstroms while the HDMI interface would require a transistor gate oxide thickness of 50 Angstroms. These different thicknesses of transistor gate oxide are incompatible with standard processing.

A further problem identified by the inventors is that porting high speed analog interfaces to a new process consumes a lot of resource in terms of time and expert attention.

BRIEF DESCRIPTION OF THE DRAWINGS

For an understanding of some embodiments of the present invention and as to how the same may be carried into effect, reference will now be made by way of example only to the accompanying Figures in which:

FIG. 1b shows a schematic side view of the package incorporating two dies of FIG. 1a;

DETAILED DESCRIPTION OF THE DRAWINGS

Figure 1A:
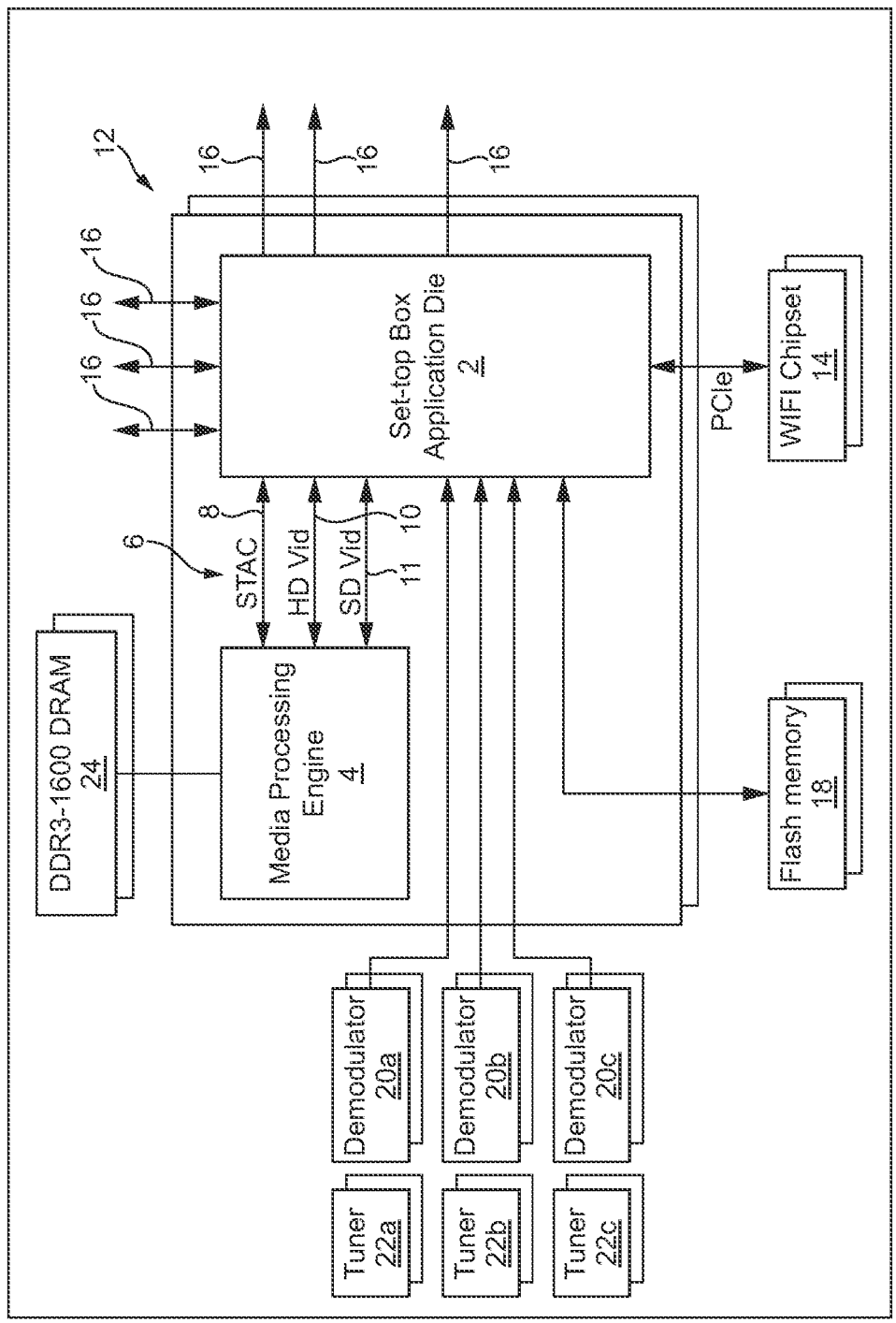
FIG. 1a shows a schematic plan view of a package incorporating two dies and circuitry to which the package is connected.

In embodiments of the present invention, a plurality of integrated circuit dies are incorporated within a single package. In the following examples, a single package having two dies is described. However, it should be appreciated that this is by way of example only and more than two dies may be provided in some embodiments of the invention.

A communication channel is provided between the systems on the different silicon dies. The communications channel or on-chip interconnect may provide high bandwidth and low latency. In some embodiments, various signals are integrated onto the communication channel in order to reduce pin count and power consumption. Some embodiments of the present invention may provide a universal communication channel which allows the interface to retain their compatibility with the channel that allows for different implementations of the interfaces.

By allowing more than one die within a single package, decoupling of the analog blocks from the digital blocks can be achieved. For example, the analog circuitry can be provided on one die and the digital circuitry can be provided on a different die. In this way, the analog die may have its required voltage and/or transistor gate oxide thickness while the digital part of the die can use a different voltage and/or transistor gate oxide thickness. It should be appreciated that in some embodiments, the digital die may predominantly contain digital circuitry and a relatively small amount of analog circuitry and/or the analog die may predominantly contain analog circuitry and a relative small amount of digital circuitry.

Alternatively or additionally, each die may be designed to provide a particular function which may require various different mixes of analog and digital circuitry in the implementation of that particular function. In some embodiments, this may mean that the same die or same design for a die may be used in different packages. By introducing this modularity, design time may be reduced.

In the following, a single package comprising two or more dies will be referred to as a system in package.

By way of example only, one system in package may comprise: a 32 nanometer die containing high speed CPUs (central processing units), one or more DDR3 controllers and other elements; and a 55 nanometer die containing analog PHYs (physical layer devices). As the analog circuitry is contained on a different die to that containing the digital circuitry, the 32 nanometer die is able to maximize the benefits from the reduction in size.

In the following example, a system in package embodiment is described for a set top box. In particular, in the same package are a set top box application die 2 and a media processing engine 4. However, this is by way of example only. For example, one package could comprise an RF (radio frequency) die and a TV tuner die. Alternatively, a wireless networking PHY layer die may be incorporated in the same package as an RF die.

Alternative embodiments may be used in a wide variety of different contexts. The following is a non exhaustive list of where embodiments of the invention may be used: mobile phone chips; automotive products; telecoms products; wireless products; gaming application chips; personal computer chips; and memory chips.

Embodiments of the invention may be used where there are two or more dies in a package and the dies are manufactured in different technologies. Embodiments of the invention may alternatively or additionally be used where it is advantageous for at least one of the dies to be certified, validated or tested independently for conformance to some standard. Embodiments of the invention may alternatively or additionally be used where one of the dies contains special-purpose logic to drive specific wireless, optical or electrical interfaces so that the other die(s) can be manufactured independently and not incur any cost associated with the special purpose logic. Embodiments of the invention may alternatively or additionally be used where one of the dies contains information (for example encryption information) which is to be withheld from the designers/manufacturers of the other dies. Embodiments of the invention may alternatively or additionally be used where one of the die contains high-density RAM or ROM and it is preferable to separate this from standard high speed logic for reasons of fabrication yield and/or product flexibility.

Figure 1B:
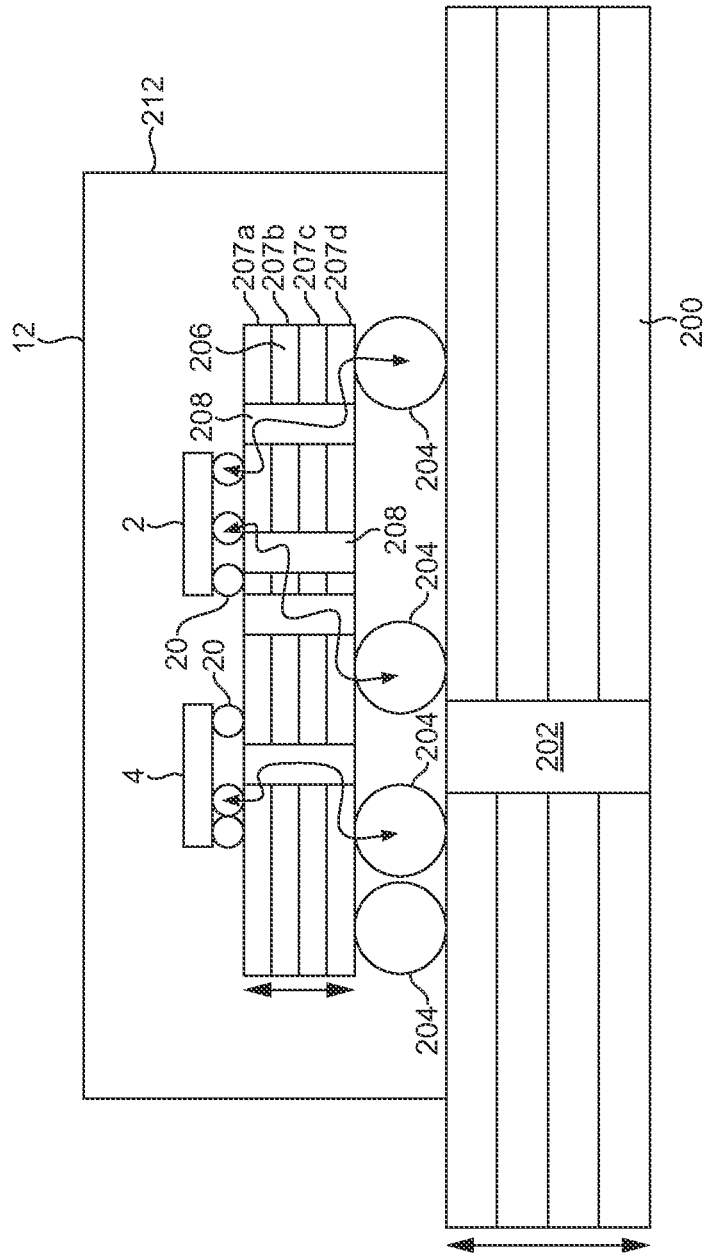

Reference is now made to FIGS. 1a and 1b which show a system in package 12. The system in-package 12 comprises a set top box application die 2 and a media processing engine die 4. The two dies, 2 and 4, are connected to each other via an interface 6. The interface 6 comprises a bidirectional point-to-point-interface 8, a HD (high definition) video output 10 and a SD (secure digital) video output 11 from the media processing engine 4 to the set top application die 2.

The dies 2 and 4 are connected to circuitry outside the system in package. The set top box application die 2 is connected to a Wi-Fi chipset 14 and to a FLASH memory 18. The set top box application die 2 also comprises inputs/outputs 16. It should be appreciated that the number of inputs/outputs shown is by way of example only and more or less than six inputs/outputs may be provided. Each of these inputs/outputs may be both an input and an output, just an input or just an output. The set top box application die 2 is also connected to three demodulators 20a, 20b and 20c. Each of the demodulators is connected to a respective tuner 22a, 22b and 22c.

The media processing engine die 4 is connected to a DDR3-DRAM 24.

Reference is made to FIG. 1b which shows the system in package of FIG. 1a, but from the side. Again, this is a schematic representation of the system in package 12. The system in package 12 comprises PCB (printed circuit board) layers 200 with vias 202 extending there through. A substrate structure 206 is supported by balls 204 of solder, the solder balls 204 being between the PCB 200 and the substrate structure 206. The substrate structure 206 is provided with vias 208 there through. The substrate structure 206 may be of fiber glass. The substrate structure 206 has layer 0 referenced 207d which contacts the solder balls 204. Next there is the second layer, layer 1 referenced 207c, which is the power layer. Next there is the third layer, layer 2, referenced 207b, which is the ground layer. Finally there is the fourth layer, layer 3, referenced 207a, which is the signal layer which is in contact with solder balls 210.

The solder balls 210 on the side of the substrate structure opposite to that facing the PCB layers 200 support the dies 2 and 4. As is known, electrical paths are provided by the solder balls and the vias. The interface 8 is defined by paths from one die to the other die comprising: solder balls connected to the one die; the solder balls connected to the one die being connected to the signal layer of the substrate structure 206, the signal layer of the substrate structure being connected to respective solder balls associated with the other die. In some embodiments the connection path may include vias in the substrate structure. It should be appreciated that this is only one example of a possible implementation for the interface and the connections of the interface 8 may be implemented in a number of alternative ways.

The elements which are supported by the PCB layers 200 are then encapsulated in a plastic molding 212 to provide a system in package.

Embodiments of the invention use a common interface which avoids the need for a relatively large number of wires dedicated to particular control signals. Some embodiments are such that modification of the die to take into account new or different control signals is simplified. Some embodiments of the invention are such that testing, validation and packaging of the die is simplified and the inter-die communication can be simplified.

One or more embodiments of the invention may address the problems with the so-called subsystem approach.

Figure 2:
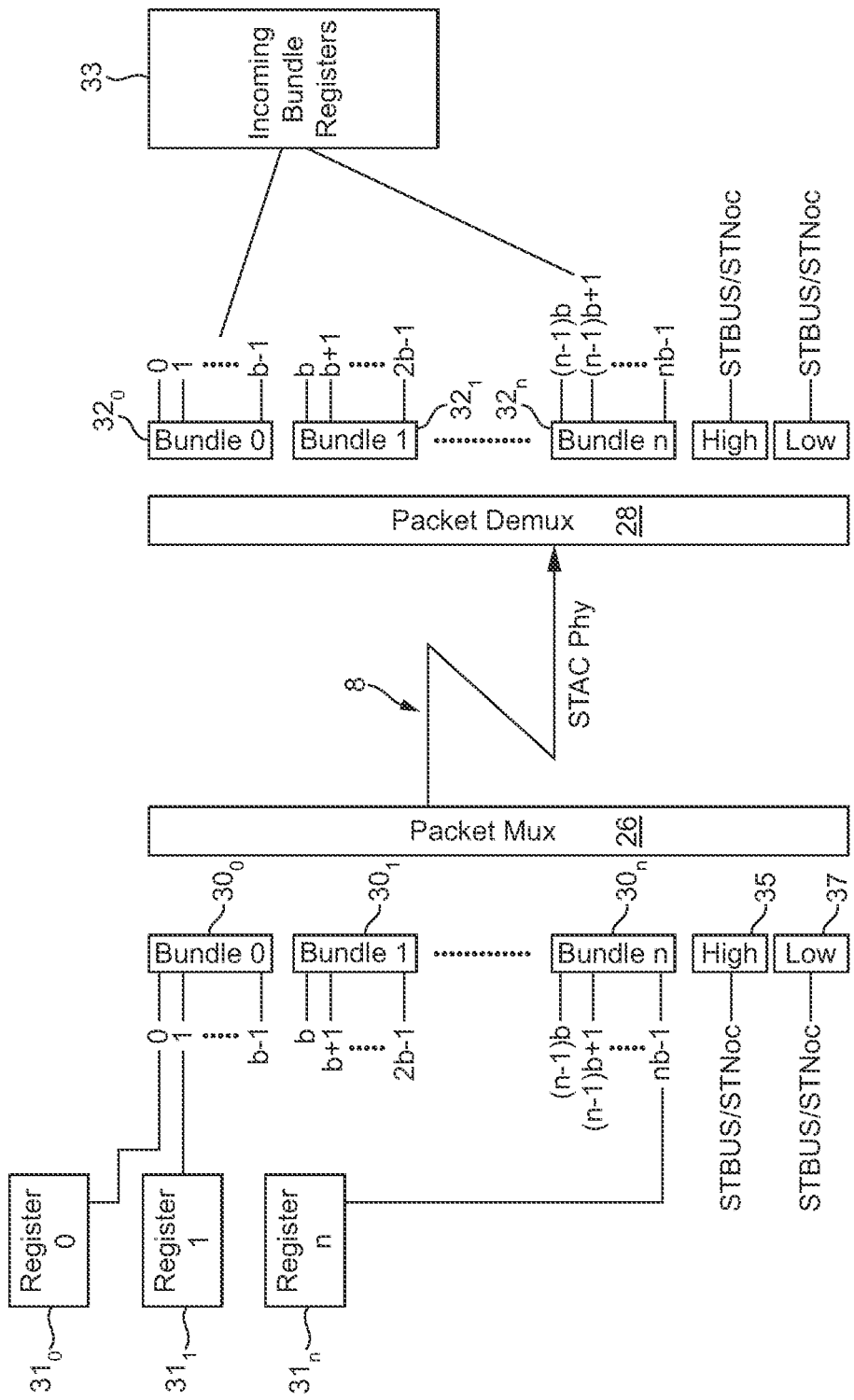
FIG. 2 schematically shows the interface between the two die of FIG. 1.
Figure 3:
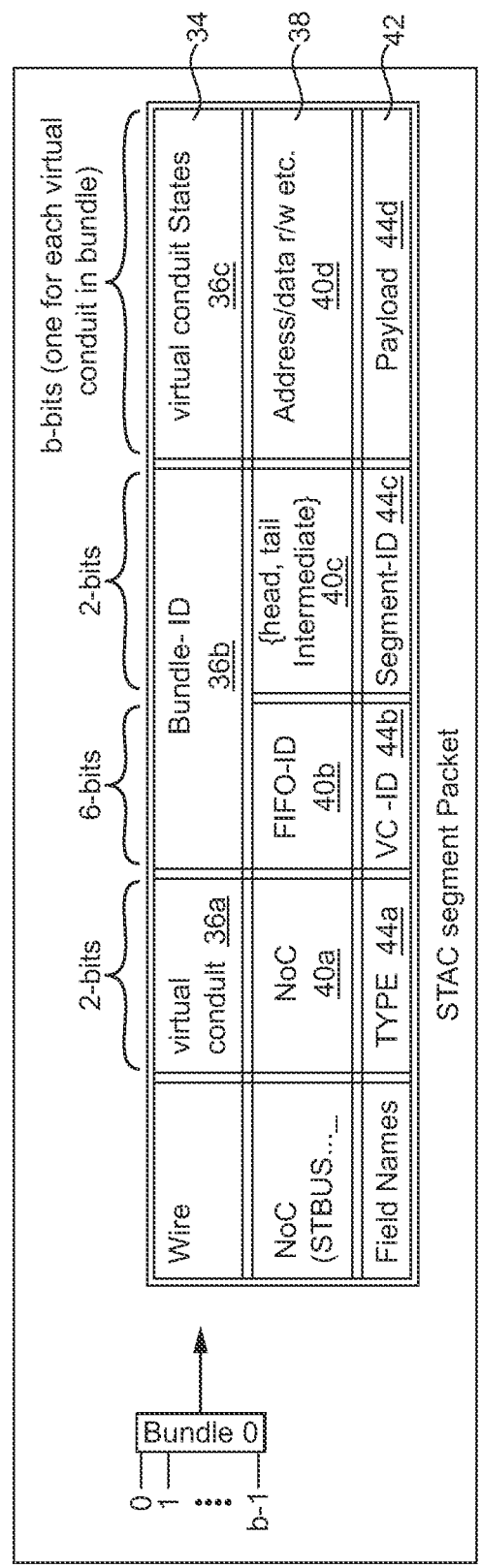
FIG. 3 shows schematically different types of the packets transmitted from one die to the other.
Figure 4:
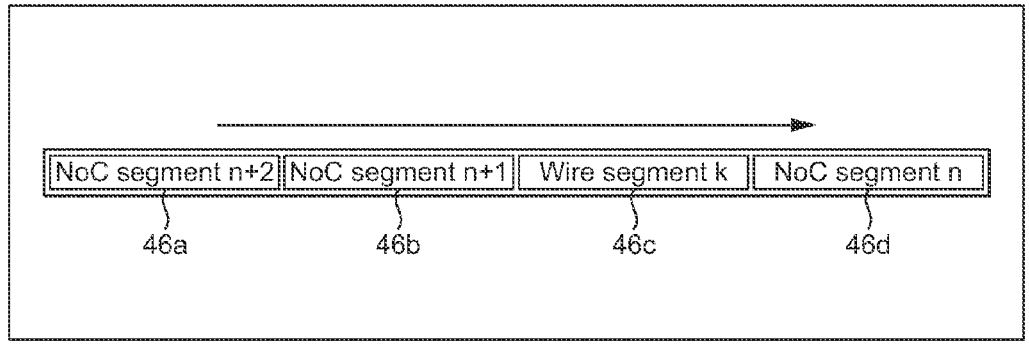
FIG. 4 illustrates schematically the multiplexing of packets.

Reference will now be made to FIGS. 2 to 4. In the following, a virtual conduit is described in which control signals such as interrupts, handshakes, reset and other narrow signals can be multiplexed with a standard memory transaction. In a typical system-on-chip (SoC) system the majority of communication is performed over a bus interconnect, via memory mapped transactions. The Bus/NoC (network-on-chip) is wide (e.g. 80 bits for NoC, 100+ bits for the bus). These narrow 'out of band' signals convey information on typically a small number of fixed function wires; within a SoC there may, however, be many of them. It should be appreciated that these numbers are by way of example only.

The memory mapped transactions will typically be issued from an initiator port or the like. The transactions issued from the initiator port will include an address which is used by a router to route the transactions. On the receive side, the transaction is received by a target port or the like and then routed by a router to a destination depending on the address information. The memory transactions can be considered to be routed point-to-point transactions. In contrast a control signal is point-to-point, without requiring any routing. In other words a line or wire on one die is mapped to a corresponding line or wire on the other die.

For the control signals, a signal change on a wire in one die is communicated via the interface and associated circuitry such that there is corresponding signal change on a corresponding wire in the other die in such a manner as to be functionality transparent to the entities which communicate using this wire.

Examples of control signals include, but are not limited to, interrupts, handshakes (e.g. request, acknowledge pairs), resets, power state change requests, enable/disable signals, alarm signals, synchronization signals, clock signals, status signals, functional mode setting signals, sense signals, presence detect signals, power status signals, endian signals, security mode signals, LED (light emitting diode) control, external chip control (e.g. chip select, write protect, chip enables etc) and signals taken off-chip (i.e. outside the package) to control associated electronic items.

It should be appreciated that FIGS. 2 to 4 are used to illustrate the communication between the dies 2 and 4 of FIG. 1.

In some embodiments of the present invention, the majority of the communication between the two dies 2 and 4 connected by the inter-die interface 8 will be read and write transactions to the memory address space associated with the respective dies. This traffic will generally be two-way traffic. However, there may also be communication in the form of the assertion and/or de-assertion of interrupt lines, DMA (direct memory access) handshakes, reset requests and acknowledgments, power down requests, and/or the like. These signals can additionally or alternatively include any one or more of the controls signals mentioned above. These latter signals are the control signals discussed previously and are sometimes referred to out of band signals (OOB).

In one embodiment of the present invention, the memory transactions (for example read and write) are carried by a sequence of packets over the inter-die interface 8. In this regard, reference is made to FIG. 2 which shows the inter-die interface.

A packet multiplexer 26 is provided on each of the dies. This is connected to the inter-die interface 8, at the other end of which is a respective packet de-multiplexer 28. Each die thus comprises a packet multiplexer for the traffic going to the other die and a packet de-multiplexer for the traffic received from the other die. For simplicity, only one packet multiplexer and de-multiplexer is shown. As can be seen, the packet multiplexer receives an input from a respective bundle $30_0$-$30_N$. In the example shown, there are N+1 bundles each of which has b wires. In this example, each bundle has the same number of wires. However in alternative embodiments of the invention, each bundle may have different numbers of wires. Each wire is connected to a respective register $31_{0-n}$ which holds the current signal value associated with that wire.

Each wire is allocated a predefined position within one bundle. One or more respective signals are associated with a particular wire. Thus a particular signal will be allocated a particular wire in a particular bundle of wires. For example, the power down request will be allocated wire number b+1 in bundle 1. Each bundle is arranged to be transmitted as a single packet together with a bundle identifier which is referred to as a virtual channel identifier.

The packet may be atomic.

The packet multiplexer 26 receives an input in the form of packets from one or more of the bundles. The packet multiplexer also receives memory transactions which have been split into packets. The packet multiplexer multiplexes the packets output by the bundles and the memory transaction packets and transmits them across the point-to-point interface 6 to the packet de-multiplexer 28.

The packet de-multiplexer 28 uses the bundle identifier of the bundle packets to direct each received bundle packet to a respective incoming bundle circuitry $32_0$ to $32_n$. There is a respective incoming bundle circuitry 32 associated with each bundle from the transmit side. The respective incoming bundle circuitry 32 associate each bit in the received packet with the associated output wire and output the associated value to the associated incoming bundle registers 33. In FIG. 2, the bundle registers 33 are shown as a single block for simplicity. In practice a register is associated with each wire.

There may be one-to-one mapping. For example, if wire 1 on bundle 0 has a particular signal value on the transmit side, the output 1 of the register for bundle 0 will have that signal value. In alternative embodiments, there may be a more complicated mapping between the input on a particular wire of a particular wire and the output of the register. For example there may not be one to one correspondence between wires of a particular bundle and a given register. The wires of one bundle may correspond to respective outputs of different registers.

In one embodiment two or more wires may map to a fewer number of wires. Alternatively one or more wires may map to a greater number of wires.

In one embodiment of the invention, the state of each wire in the bundle is not continuously transmitted. The state of the wire is sampled at regular intervals and these samples are transmitted across the interface 8 in a respective wire packet along with data traffic. The sample may be used to specify the state of the respective register 31 which holds the state of each out of band signal on the transmit side of the interface. In the embodiment shown, there are n+1 registers $31_{0-n}$.

The number of registers may be the same as the number of wires or less than the number of wires. In one embodiment, each register is connected to a single wire. Alternatively or additionally, one register may be connected to two or more wires. Where a register connected to more than one wire a plurality of bits may be used to represent information such as a state or the like.

In one embodiment, the transmission in the interface 8 is performed bi-directionally so that the wires can be virtually connected from either side. As mentioned each die has a packet multiplexer and a packet de-multiplexer. The packet multiplexer and de-multiplexer may share the same physical interface so that a die will receive and transmit via a common interface that is on the same physical connection. Alternatively, a packet multiplexer and de-multiplexer on one die have separate interfaces. In other words, a die will receive and transmit on different interfaces.

The interface can be regarded as a set of wires or connectors extending between the two dies. The wires may be subdivided into one or more lanes. Where the wires are subdivided into lanes, the or each lane may be arranged to carry packets.

It should be appreciated that in embodiments of the invention, the same connectors or wires which carry the memory transaction packets also carry the bundle packets. The interface 8 may be considered in some sense universal and is capable of carrying different classes of communication such as signals (control signals) and busses (memory transactions).

The interface 8 can be implemented in serial or parallel form. The data in a packet may be transmitted serially or in parallel. It is preferred that the interface 8 be a high speed link.

In a preferred embodiment of the present invention, the sampling rate, the number of bundles transmitted and/or the priority of transmission of these bundles can be configured as required.

In one embodiment, the states of signals comprising each wire bundle can be periodically sampled at a rate which is separately configurable for each bundle. In other words, each bundle can have a different sampling rate associated therewith.

Each bundle sample is formatted into a packet as illustrated in FIG. 3. The bundle sample may be formatted in the respective bundle 30 where the additional information to packetize the bundles samples are added. In an alternative embodiment, the multiplexer may incorporate circuitry which is configured to perform or complete the packetization.

The bundle sample packet is referenced 34. The first field 36a of the bundle sample packet 34 comprises information to identify the packet to the receiving logic as a wire bundle packet. In this example, this field of the packet comprises two bits. However, it should be appreciated that in alternative embodiments of the invention, more or less than two bits may be used for this field. This field is followed by a bundle identity field 36b. The bundle identity field allows the packet to be routed to the appropriate bundle circuitry 32 on the receiving die. This therefore identifies the bundle from which the packet originates. In this example, the field comprises 8 bits. However, it should be appreciated that more or less than 8 bits may be used. The packet payload 36c comprises b bits, one for each input wire to the bundle on the transmitting side.

By way of example only, b may be, for example 80 bits. In one implementation, there may be four bundles. The appropriate payload is routed to the appropriate bundle circuitry 32 on the receive side, shown in FIG. 2 using the bundle identification. The bundle circuitry 32 will map the bundle payload to the appropriate incoming bundle register 33.

It should be appreciated that the sizes of the respective fields of the packet may be changed in different embodiments of the invention. It should be appreciated that the order of the fields may also be changed in different embodiments of the invention.

In one embodiment of the present invention, each bundle is sampled at a rate of $(CLK)/2^N$ where CLK is the clock rate and N is one of: (2, 3, 4 . . . 31). For example, a clock CLK of 400 MHz and a bundle configured with N=8 would sample that bundle at 1.56 MHz and would produce a wire packet for that bundle every 640 nanoseconds.

In one embodiment of the present invention, at any given time there may be none, one or more than one packet ready for transmission. The packet multiplexer 26 illustrated in FIG. 2 will comprise logic to arbitrate, if necessary, and decide on the transmission order of the packets. This will typically produce a time division multiplexing of bundle packets and memory packets on the physical transmission on the interface between the first and second die. This is shown in FIG. 4.

As mentioned previously, the interface 8 is also used for the memory transactions such as memory reads and/or writes. An example of the memory transaction packet 38 which is sent across the same interface 8 is also shown in FIG. 3 and is referenced 38. The first field indicates that the packet is a NoC (network-on-chip) packet. The second field 40b indicates the FIFO-ID (first-in first-out identifier). As shown in FIG. 2, the die comprises queues implemented by FIFOs. In the embodiment shown in FIG. 2, there are two FIFOs which provide a high priority queue 35 and a low priority queue 37. The interconnect delivers the memory transaction to the appropriate FIFO depending on which queue the transaction belongs to. There can be more than two queue classifications in alternative embodiments. The third field 40c indicates if the packet is a head packet, a tail packet or an intermediate packet. One memory instruction may be sent in a plurality of different packets.

The final field is the payload field 40d which includes the address and/or data to be written or read and/or the associated instruction and/or the transaction attributes of belonging to the protocol used on chip to perform memory transactions. The NoC field is allocated 2 bits, the FIFO-ID field is allocated 6 bits, information as to whether the packet is a head, a tail or intermediate packet is allocated 2 bits and the payload is allocated B bits. It should be appreciated that the actual sizes of the respective field is by way of example only and alternative embodiments may have different sizes for the fields.

As can be seen, the wire packet 34 and the NoC 38 packet have the same format as represented by the general packet format 42. The first 2 bits 44a represent the type of the packet. The second 6 bits represents the VC-ID 44b (virtual channel-identity). This is followed by the segment identifier 44c and the payload 44d. The type is allocated 2 bits, the VC-ID 44b is allocated 6 bits, the packet ID segment ID 44c is allocated 2 bits and the payload 44d is allocated B bits.

In FIG. 4, four multiplexed packets 46a, 46b, 46c and 46d are shown. Packets 46a, 46b and 46d are NoC packets and in this example relate to one operation. The third packet is a wire packet 46c which is associated with, for example bundle k.

In one modification, a time slot structure may be used where packets are allocated to a particular time slot. This may be controlled by the packet multiplexer or control circuitry associated therewith. Time slots could be assigned to particular wire bundle packets or to memory transaction packets belonging to a particular priority queue.

In embodiments of the present invention, the packets may be sent serially or in parallel. One embodiment of the present invention involves transmitting the packets in a narrow parallel form with, for example, seven or fifteen wires.

The packets, when received are latched into the bundle circuitry 32 on the receiving side. Once latched, the incoming bundle circuitry 32 causes the values to be stored to the appropriate register 33. The signals can then be asserted to where the incoming signals need to be mapped on the incoming die. For example, interrupts will typically be mapped directly to the interrupt controller of the main CPU.

The packet/bundle mapping is performed in a simple one to one manner without permutation, in one embodiment of the invention. This means that wire W of bundle B on the outgoing bundle is mapped to wire W of bundle B on the incoming bundle circuitry 32 for all implemented values of W and B.

In one embodiment, the receiver retains a capacity to accept a wire packet for each bundle at any time. The bundle transmissions therefore do not need to be flow controlled, in one embodiment of the present invention, in the same way as the memory packets with which they share the link. In one embodiment of the present invention, the NoC memory packets have flow control mediated by the exchange of special flow control packets. These indicate to the transmitting die the capacity of the receiving die to accept future packets. Of course other mechanisms can be used in alternative embodiments of the invention.

In one embodiment, quality of service guarantees are provided in as much as limited latency and limited jitter may achieve a transport suitable for the carriage of synchronization and clock signals.

As mentioned previously, the interface between the two dies will convey signals relating to interrupts, resets, power-state change requests, handshakes, for example for controlling DMA and many other types of control signals such as those mentioned previously. Quality of service (QoS) of the transmission and reception of the signals may be affected by one or more of the following five parameters: 1. Delay; 2. Jitter; 3. Guaranteed delivery; 4. Delivery order; 5. Error.

In some embodiments of the present invention, the wires are sampled at a finite rate and the wire bundle packets are multiplexed across the link and hence may be delayed in transmission by an amount of time depending on what other packets may be attempting to use the link concurrently.

In one embodiment of the present invention, the bundle packets may be guaranteed to be delivered in the order in which they were transmitted, without any overtaking. As this is implemented in a very controlled electrical environment, either on silicon or between silicon die within the same package, the transmission may be assumed to be substantially error free.

In some embodiments of the present invention, the circuit is arranged to have a limited delay between an incoming signal changing state at a bundle bank register on the transmitting die and the equivalent signal changing state of the corresponding bundle bank register on the receiving die. Some embodiments of the present invention may also commit to a constrained variation in the delay, discussed above. For example, a quality of service commitment would involve being able to guarantee that the delay for the interface will be no more than D nanoseconds and the jitter will be no more than J nanoseconds.

As will be discussed in more detail, some embodiments of the present invention control the sample rate S at which the signal is converted to a bundle packet. The prioritization P of the queue at the interface which arbitrates which of the wire packets ready for transmission will be transmitted next can alternatively or additionally be controlled. Embodiments of the present invention may be able to sample a bundle and transmit a packet, not based on a regular sampling, but whenever there is a change in state of any single signal associated with a bundle. This may be within a predetermined time frame.

In one alternative embodiment of the invention, when a signal changes state this starts a period. When that period expires, the bundle packet is sent to the arbiter. In this way any other signals which change state within that period will be captured.

By controlling the sample rate S, the sampling method and/or the prioritization P, control over the delay D and the jitter J may be achieved in some embodiments of the present invention.

It should be appreciated that in some embodiments, a regular sample rate may be preferable while in other embodiments, an activity based sampling may be desirable. Indeed, in some embodiments of the invention, the same system may use sample based bundles and activity based bundles, depending on the circumstances. For example, in some situations in order to have a satisfactorily low delay and jitter, with sample based bundles, this may require a relatively high sample rate S. In some embodiments, this may give rise to problems because the link may become inundated with wire bundle packets, many of which may not actually be carrying a state change and therefore redundant. This may give problems with the service received by other users of the link. Accordingly, in some embodiments, logic circuitry may be provided which triggers a sampling of the bundle register only when it detects an edge on any of the signals which are latched by that register. In this case, the packets do not have a sample interval wait period and so the end to end delay is simply calculated by adding the performance of various circuits involved in generating and receiving the packet so that the delay is limited. This mechanism means that the link is not saturated.

However, it should be appreciated that in some embodiments, the activation triggered packets may lead to a proliferation of packets where wires are activated close in time but are nevertheless included in separate packets. Accordingly, different situations may use sample based or activation based bundles. In one embodiment of the present invention, some bundles may be sample based and some bundles may be activation based. It should be appreciated that in some embodiments the sample of the same bundle may be sample based at one time and activation based at another time.

Figure 5:
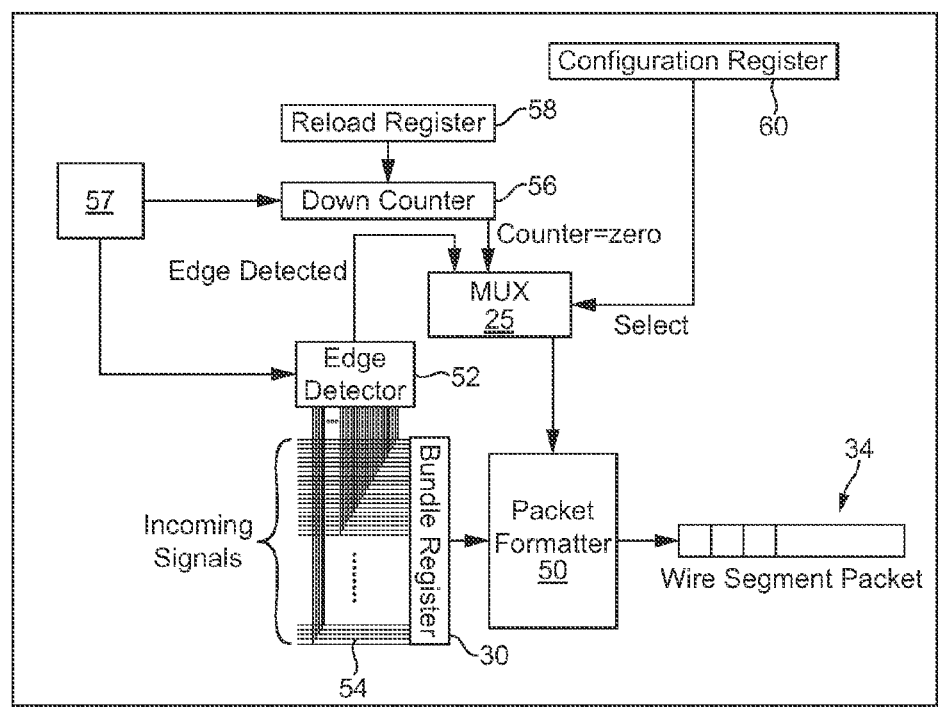
FIG. 5 schematically shows the circuitry in one die for the generation of packets to be transmitted from that die to the other die.
Figure 6:
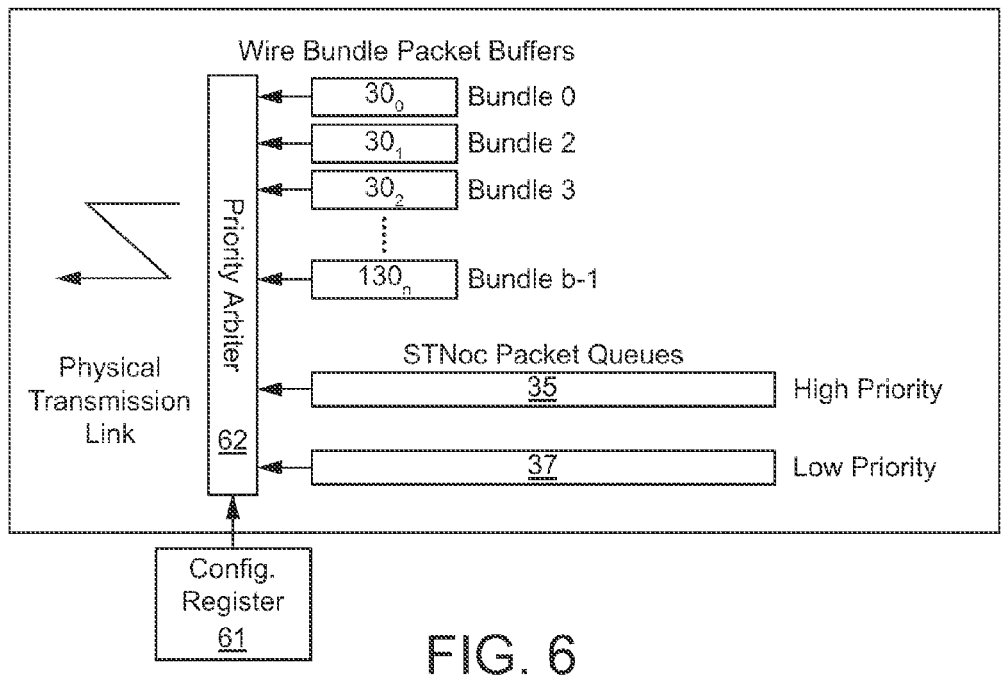
FIG. 6 schematically illustrates the prioritization for the transmission of the packets from one die to another.
Figure 7:
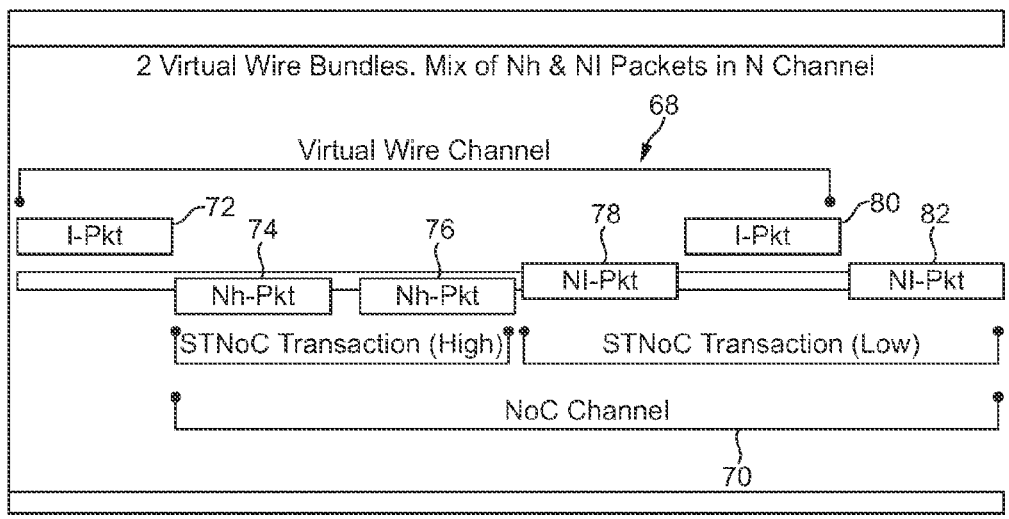
FIG. 7 shows the multiplexing of the packets on the link from one die to another.

Reference will now be made to FIGS. 5 to 7. FIG. 5 shows the sampling of wires and the generation of packets under the control by either a down counter 56 or an edge detector 52 depending on the setting in a control register 60. In particular, in FIG. 5, one bundle register 30 is shown. It should be appreciated that each bundle register or only some (or even one) of the bundle registers may be provided with the circuitry shown in FIG. 5.

The output of the bundle register 30 is connected to a packet formatter 50. The multiplexer 26 of FIG. 2 operates on the output 34 of the formatter 50. The packet formatter 50 configures the output of the bundle register 30 into a wire packet 34 by adding the type ID and the bundle ID to the B bits representing the states of the wires of the bundle.

The edge detector 52 is connected to each of the wires 54 associated with the bundle register. The edge detector 52 is arranged to detect every time there is a transition on a signal on the respective wire. When an edge on any one of the wires is detected, the edge detector provides an output to a packet multiplexer 25.

Attached to the multiplexer 25 is the down counter 56 which provides an output to the multiplexer 25 every time the count reaches 0. The down counter 56 is connected to a reload register 58. Other types of counter or alternative timing circuitry may be used in alternative embodiments of the invention. The function of the reload register 58 and down counter 56 is to control the rate at which the bundle register is sampled. Accordingly, by controlling the value in the reload register 58, the sampling rate can either be decreased or increased. The multiplexer 25 is also connected to a configuration register 60. The configuration register 60 will control whether the multiplexer 25 is arranged to sample the bundle because the count has reached 0 or because an edge has been detected.

In some embodiments of the present invention, where only sample based packets are provided, the configuration register and the edge detector may be omitted. Likewise, on those embodiments where only activity based sampling is used, the reload register, down counter and configuration registers may all be omitted.

Reference is now made to FIG. 6 which shows a priority arbiter 62. This arbiter 62 is provided in the packet multiplexer 26 shown in FIG. 2. The priority arbiter is arranged to receive an output from each of the N bundles $30_0$-$30_N$. The priority arbiter 62 is also arranged to receive an output from a first network on chip packet queue 35 and a second network on chip packet queue 37. The first queue 35 is used for relatively high priority memory transactions while the second queue 37 is used for relatively low priority memory transactions. In some embodiments of the invention, there may be a single queue for memory transactions. In alternative embodiments of the invention, there may be more than two queues for the memory transactions. In yet another embodiment, queues can be shared by the bundle packets and memory transactions.

FIG. 7 schematically shows the multiplexing of the wire (bundle) packets with the memory transaction packets.

As can be seen from FIG. 7, the interface can be regarded as being made up of a virtual wire packet channel 68 and a network on chip packet channel 70. The channels are multiplexed together. The packets are multiplexed in the following order:

A first wire packet 72 is followed by second and third network on chip transaction packets 74 and 76. These latter two packets come from the high priority queue. This is then followed by the fourth packet which is a network on chip packet 78 with a low priority. A second wire packet 80 follows and finally there is a second low priority network on chip transaction packet 82. It should be appreciated that this example is illustrative only and of course in different embodiments the order of the packets may be changed.

In particular, the system for implementing quality of service uses the configuration register 61 for the link. This configuration register 61 allows the specification of one or more of the following: priority of each bundle; if a bundle is to be sampled regularly or if activation based sampling is to be used; sampling rate for each bundle; an enable bit for each bundle; a priority for the high priority network on chip (that is memory transactions) packet queue; and a priority for the low priority network on chip packet queue.

As mentioned previously, there may more than two queues/ priorities.

The assigned priorities are used by the arbiter 62 to determine the sending sequence when more than one bundle packet or network on chip packet is ready to be transmitted. When two or more packets have the same priority, then the arbiter may either use a round robin priority or select randomly.

The sample rate for each bundle indicates the clock rate at which samples are generated for a packet. The configuration register 61 is arranged to contain a value N which is used in the formula $CLK/2^N$ discussed above. In particular, the value $2^N$ is placed in the reload register 58. This value is used as a start value of the down counter which decrements the clock rate so that after $2^N$ cycles have passed, the counter 56 will be at 0 and will signal to the multiplexer 25 that a sample is due. When the down counter has reached 0, the down counter is reloaded with the contents of the reload register and the process restarts.

In one modification, for each sample, a comparison is made with the previously transmitted bundle. If there are no differences between the two bundles, then no packet appears transmitted. In this way, bundle samples may only be transmitted as packets when they contain state transitions on one or more of the virtual wires. This may save power. However, this will require the packet formatter to store the previous packet and to have a comparator to compare the previous packet with the current packet.

In one embodiment of the invention, if the configuration register 61 contains $N^0$, then this value is interpreted in a special way. This indicates that the bundle is not to be sampled at regular intervals. Instead this indicates that the bundle register is to be sampled only when an edge is detected by the edge detector 52. This edge detector 52 is looking for an edge on each cycle and the edge detector signals to the multiplexer whenever such a sample is due. In this way, the need to have a separate field in the configuration register to indicate if regular sampling or activation based sampling is to be used is not required. Information on whether the bundle is to be sampled regularly or in dependence on activity is passed to the configuration register 60 which controls the multiplexer 25. Alternatively, the configuration register 61 is itself connected to the multiplexer 25 to control the operation of that multiplexor.

The bundle enable signaling is provided which indicates whether a particular bundle is enabled to generate any packets. The bundle enable signaling may be in the form of a bundle enable bit. When enabled, the bundle will generate packets using the procedure determined by the sample rate field. When not enabled, no packet will be generated and any activity on the associated signals will not be transmitted across the interface.

In one embodiment of the invention, the enable bit is written separately for each bundle. The sampling down counter commences when the bundle is enabled. This means that the bundles can be treated separately and may be arranged so that the bundle sampling may be controlled such that the circuitry is not always generating packets in the same cycle.

In one embodiment, the circuitry 57 is arranged to stagger the bundle sampling which may be advantageous in some embodiments where the typical latency could be moved closer to the best case and away from the worst case. The circuitry 57 may be implemented by software running on a suitable processor and is configured to control each of the bundles and in particular provides enable signaling to commence the down counter and/or provides enable signaling to the edge detector. In an alternative embodiment, the circuitry 57 may be omitted and the enable bit may be provided by the configuration register 61 and/or the configuration register 60.

The guaranteed delay may be the maximum delay, i.e. worst case for the virtual wires. If the bundle is uniquely given the highest priority, the delay is derived by simply summing the speed of the various blocks from the sample generation to packet production to the time it takes to cross the interface, then be de-packetized and copied into the bundle registers on the receiving side. If the bundle shares the highest priority, then the calculation may be altered to assume that the packet has to wait for a single incidence of all other packets of this priority before the packet can be sent. In the case of round robin priority arbitration, this will give an upper bound to the delay which will be suffered by an individual packet.

The jitter value is a consequence of the guaranteed worst case latency, i.e. jitter=maximum delay (maximum wait)−minimum delay (no wait).

In one modification to the described embodiments, isochronous packets may be implemented for the sampling bundles. In this implementation, a time slot is reserved in the transmission and at regular intervals for particular bundles. This would guarantee no jitter because sampling and transmission will be guaranteed a fixed time relationship and would therefore not be subject to queuing, arbitration or blocking by other interface requestors, either the other virtual wires or the network on chip requests. In this regard, reference is now made to FIG. 12 which shows circuitry for providing isochronous packets. The arbiter 224 in this modification is shown as having four bundles 220 providing packet inputs thereto. This is by way of example and the number of bundles input to the arbiter 224 may be more or less than four.

A timer 222 is provided to control the timing of the time slots. A time slot register 226 in the arbiter is configured to store information which defines which slots are reserved and for which bundle. Control circuitry 228 is configured to provide this data to the slot register 226. The control circuitry 228 may be implemented at least partially by an algorithm running on a suitable processor. The control circuitry 228 may be arranged to configure the time slot allocation on set up of the dies and/or may be arranged to change the configuration of the time slot allocation during the use of the device.

The control circuitry may allocate a slot to one bundle only, a subset of the bundles or allow any of the bundles to use the slot. Where more than one bundle has been allocated to a slot and more than one bundle provides a packet to be transmitted at the same time, the arbiter will select which bundle to allocate to a particular time slot.

Figure 12:
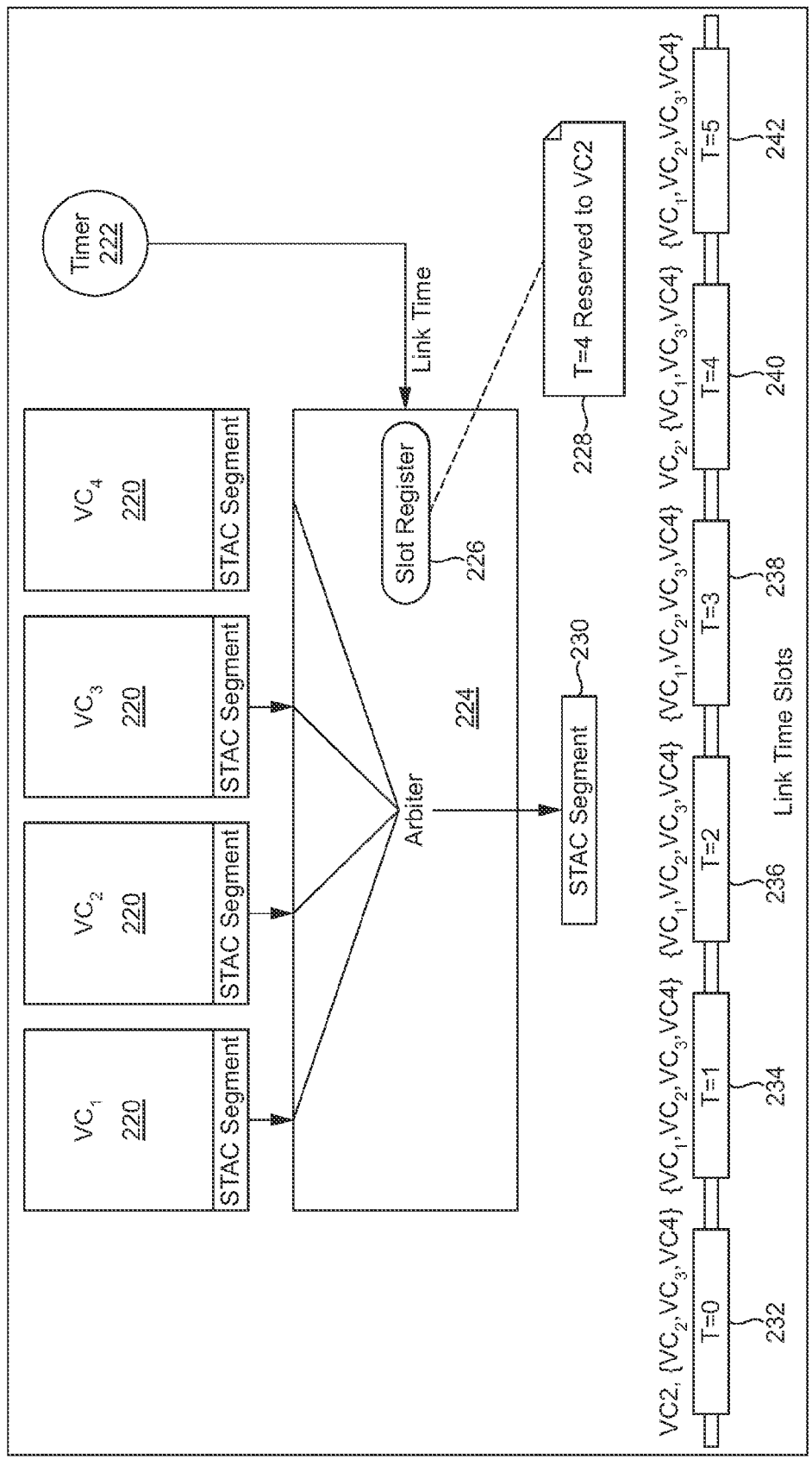
FIG. 12 schematically shows an arrangement where a given time slot is reserved for a particular bundle.

In FIG. 12, five time slots 232-242 are shown by way of example only. The first time slot 232 is allocated to the second bundle. The second time slot 234 can be used by any of the bundles as can the third time slot 236, the fourth time slot 238 and the fifth time slot 242. The fourth time slot 232 is also allocated to the second bundle. For the second and fourth time slots, if the second bundle does not have a packet to transmit, the time slot can be used by any one of the other bundles.

In one embodiment, the allocation of individual signals to a particular bundle is selected in order to improve the interface performance.

In some embodiments of the present invention, the allocation of a particular signal to a bundle may be done for the purpose of hardware design convenience or good performance for a particular use of the chip. However, often a chip will have a plurality of uses. Accordingly, the distribution of wires to a particular bundle for one use may be inefficient for another use and may result in the average number of signal transitions captured per transmission appearing lower and for example may require a higher sampling rate. For example a use case where most active wires are distributed evenly amongst many bundles rather than grouped into one or a few bundles may result in inefficient transportation.

Figure 8:
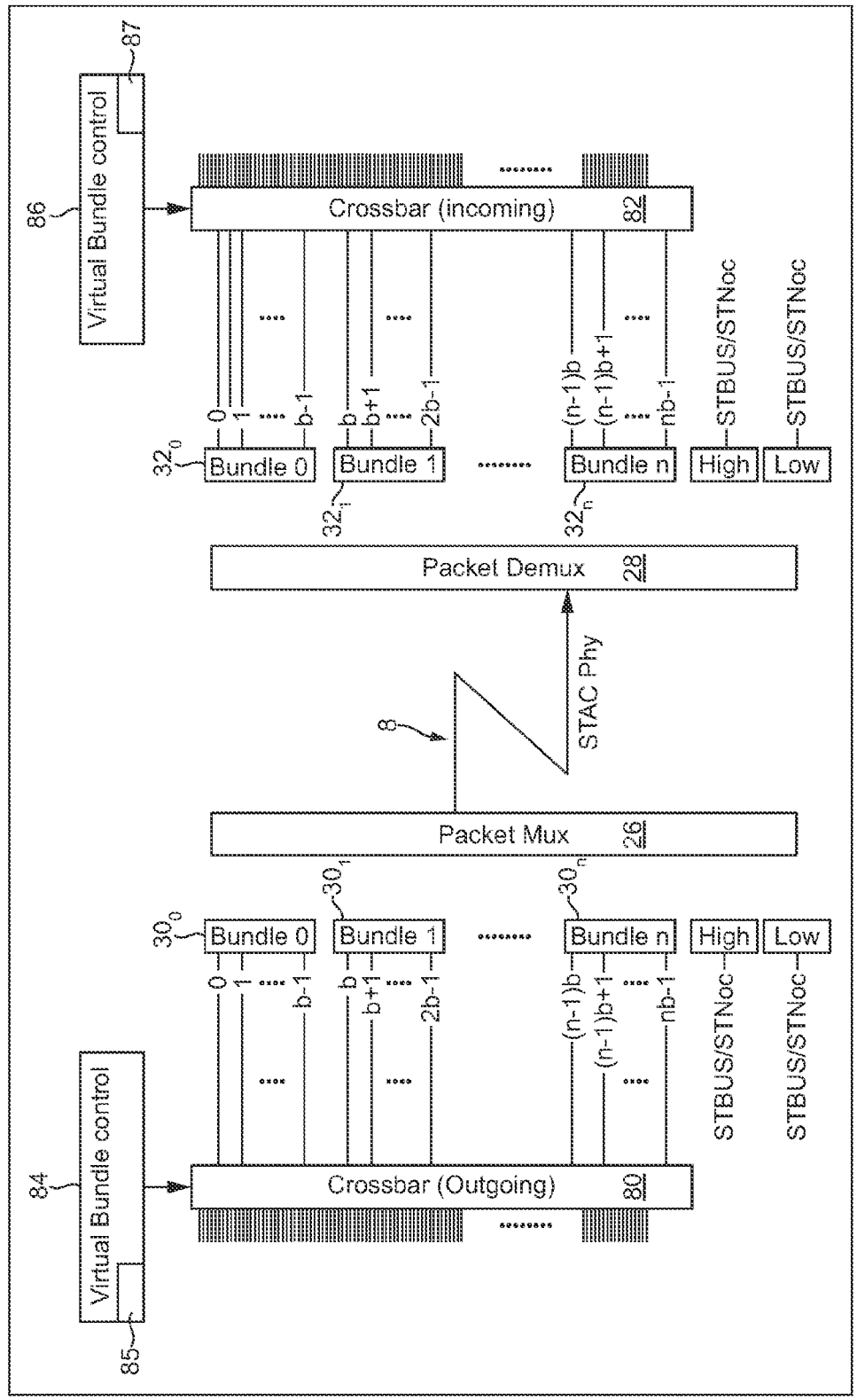
FIG. 8 schematically shows a circuit for maintaining mapping between a set of signals and respective bundle registers.

In this regard, reference is made to FIG. 8 which shows bundle configuration control circuitry 84 which allows the association between signals and bundles to be configured. This configuration carried out by the bundle configuration control circuitry may be done when the chip is being configured for a particular use or may be done during the operation of the integrated circuit. For example, the system may be configured at run time or at any other suitable time rather than having a fixed mapping imposed by the hardware. This association may be fixed for a particular application of a particular chip or in alternative embodiments of the present invention may alter during operation of the chip.

In one embodiment of the present invention, the bundle configuration control circuitry 84 comprises software which can be used when configuring the interface to allocate signals to bundles based on their expected activity and to prioritize those bundles accordingly. For example, in one embodiment, the B most active signals are allocated to bundle 0, with the next B most active signals being allocated to bundle 1 and so on. The individual sample rate of each bundle would be adjusted so that it is commensurate with the highest quality of service requirement of any signal in a given bundle. The priority may be similarly configured. This has the advantage in some embodiments of the present invention of yielding a higher aggregation of signal transitions per packet than would otherwise be the case.

Instead of bundling wires based on the expected activity, the wires can be bundled by expected priority. In one embodiment, the bundling of wires can take into account expected priority and expected activity. FIG. 8 shows a modification of the circuit shown in FIG. 2. Those elements which are the same as in FIG. 2 are numbered with the same references. A crossbar 80 is provided on the first die. That crossbar 80 has an input from each of the wires and an output for each wire of each of the bundle. For each input wire, a connection is made to a particular input of a particular bundle. The crossbar 80 and in particular its configuration of connections between respective inputs and outputs is controlled by the bundle configuration controller 84.

Similarly, on the second die, a second crossbar 82 is provided with each of its inputs receiving a respective output from a bundle register 32. The outputs of the crossbar 82 are controlled by the bundle control circuitry 86 so that the outputs are directed to the required circuit elements. Thus the bundle control circuitry 86 controls to where an input received from a respective bundle is directed.

In the embodiment described, (n+1)×b incoming wire signals are presented to the crossbar 80 on the first die which is capable of routing each signal to any of the bits in any of the n+1 bundles. In this embodiment, n is greater than or equal to 1. This embodiment only considers permutation mappings or routing although it is possible that others may be used.

The mapping is controlled by a virtual bundle control register 85 of the bundle control circuitry. This may be considered to be a set of (n+1)×b pairings between the wire signals and bundle bit positions. The bundles may be sampled in any of the ways as previously described in order to produce a system which will send the wire packets to the receiving die.

The receiving circuitry of the receiving die, as previously described, causes the bit states in the packet to be copied into the corresponding bundle 32 on the receiving die. The bundles 32 will then provide signals which are presented to the second crossbar 82 performing the reverse mapping to that performed by the bundle crossbar of the outgoing die. This reverse mapping results in the signals from the outgoing die driving the same signals on the incoming die as if neither crossbar is present. The control circuitry 86 on the receive side comprises a bundle control register 87 which stores the mapping between each position in a bundle and the destination for that wire.

The bundle registers on the transmitting and receiving die have been omitted for clarity.

In one modification to the invention, some of the bundles are arranged to have a fixed configuration, with the wires allocated to a particular bundle being unchanged, regardless of the application of the die. Other of the bundles will be configurable as discussed above.

Figure 14:
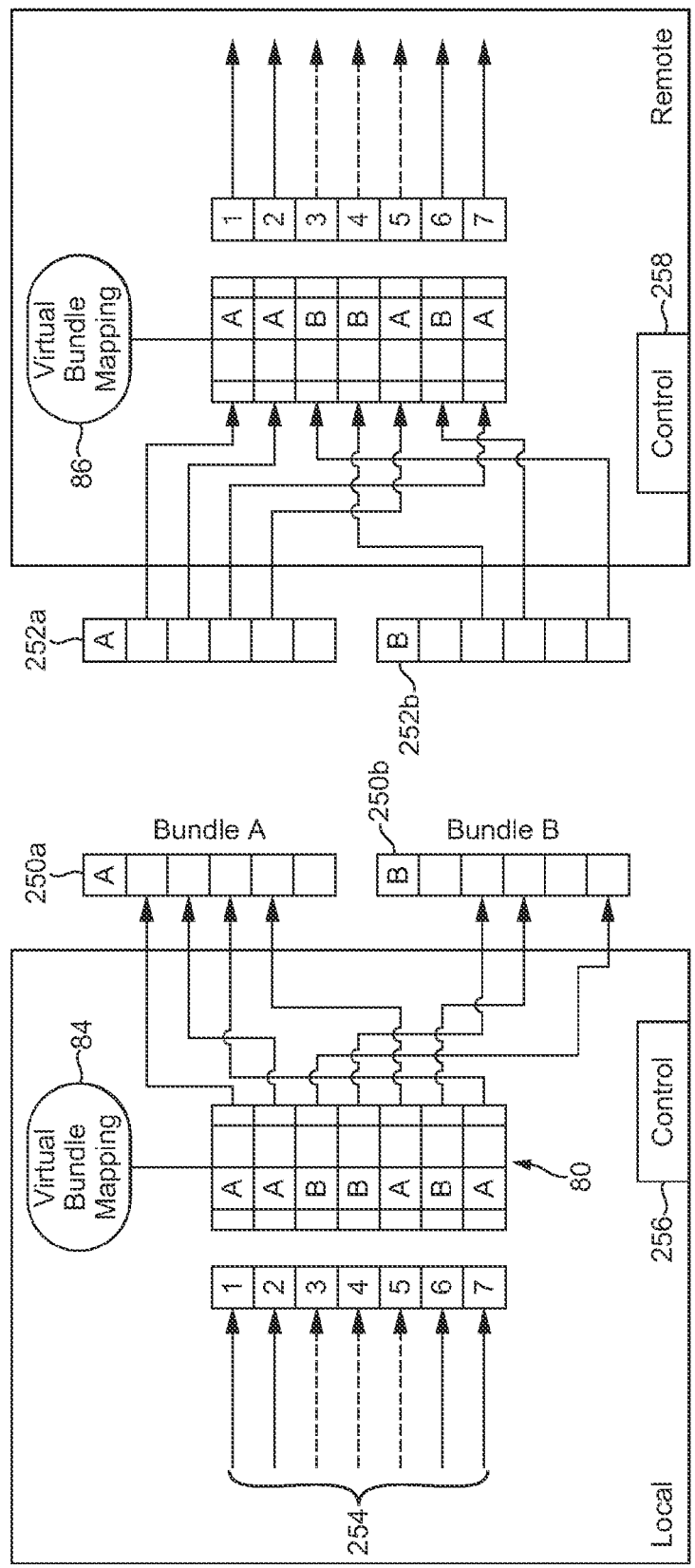
FIG. 14 schematically shows the mapping of the wires to bundles and the reversal of the bundles.

Reference is now made to FIG. 14 which schematically illustrates the virtual mapping. In this simplified example, two bundles 250a and 250b are provided on the transmit side. Seven wires 254 are provided. These seven wires 254 are input to the crossbar 80 which under the control of the mapping controller 84 causes the wires to be allocated to one of the two bundles 250 and to a particular bit position in the bundle. In this illustrative example, the first, second, fifth and seventh wires 254 are allocated to the first bundle 250a. The third, fourth and sixth wires are allocated to the second bundle 250b.

On the receive side, the received bundles 252a and 252b (which are the same as the transmitted bundles) are input to the crossbar 82. The crossbar 82, under the control of the mapping controller 86 causes the signals in the bundles to be allocated to the respective wires.

The configurable grouping is specified by:
disabling transmission of wires by for example writing disable values to a control register 256 and 258 on both sides of the interface;
writing to configuration registers (for example registers 85 and 87 of FIG. 8) which specify the mapping between the wires and the bundles and positions in the bundles—again on both (incoming and outgoing) dies. The configurations are symmetrical in some embodiments of the invention so that the grouping and ungrouping of these wires is as expected; and
enabling transmission of the wires by for example writing enable values into the control registers 256.

Alternatively or additionally the enable/disable values may be provided in one or more fields of the configuration registers. It should be appreciated that in alternative embodiments any suitable mechanism for preventing the transmission of bundles across the interface during configuration may be used.

For each wire, the configuration register may have a field which identifies the bundle allocated and a field which indicates the position in the bundle. In addition, there may be a field which indicates if transmission is enable or disabled.

In one modification, edge triggered interrupts are dealt with. Many interrupts are level sensitive interrupts. This means that once they are asserted, the interrupt stays asserted until the interrupt servicing agent has dealt with the interrupt. In contrast, edge triggered interrupt signals may be asserted and de-asserted without the interrupting agent waiting for the service agent to deal with a single interrupt. One feature of edge triggering interrupts is that the interrupt line may return to its quiescence state without the interrupt having been dealt with. The relative timing of the edges may form part of the information used by the service agent to deal appropriately with the interrupts.

It should be noted that there are other types of asynchronous signals, other than the edge triggered interrupts described. They can be supported in a similar manner to that outlined below.

The level-sensitive and edge-triggered interrupts may be transmitted differently. In the following embodiments, the data stored in RAM may enable the edge transition history to be captured—and hence maintain the edge semantics.

In one embodiment, the edge triggered interrupts are transmitted across the interface as simple write commands to a configured address. It should be noted that an edge may be indicative of an interrupt being asserted or of an interrupt being de-asserted. The value written contains an indication of the edge captured, i.e. a rising edge from 0 to 1 or a falling edge of 1 to 0 and has a time stamp. The time stamp allows the interrupt service routine to recreate the digital wave if there are several edges detected since the interrupt was last handled by reading the contents of memory at that address. The type and/or number of edges allow the interrupt service routine to determine if an interrupt is being asserted or de-asserted.

Figure 9:
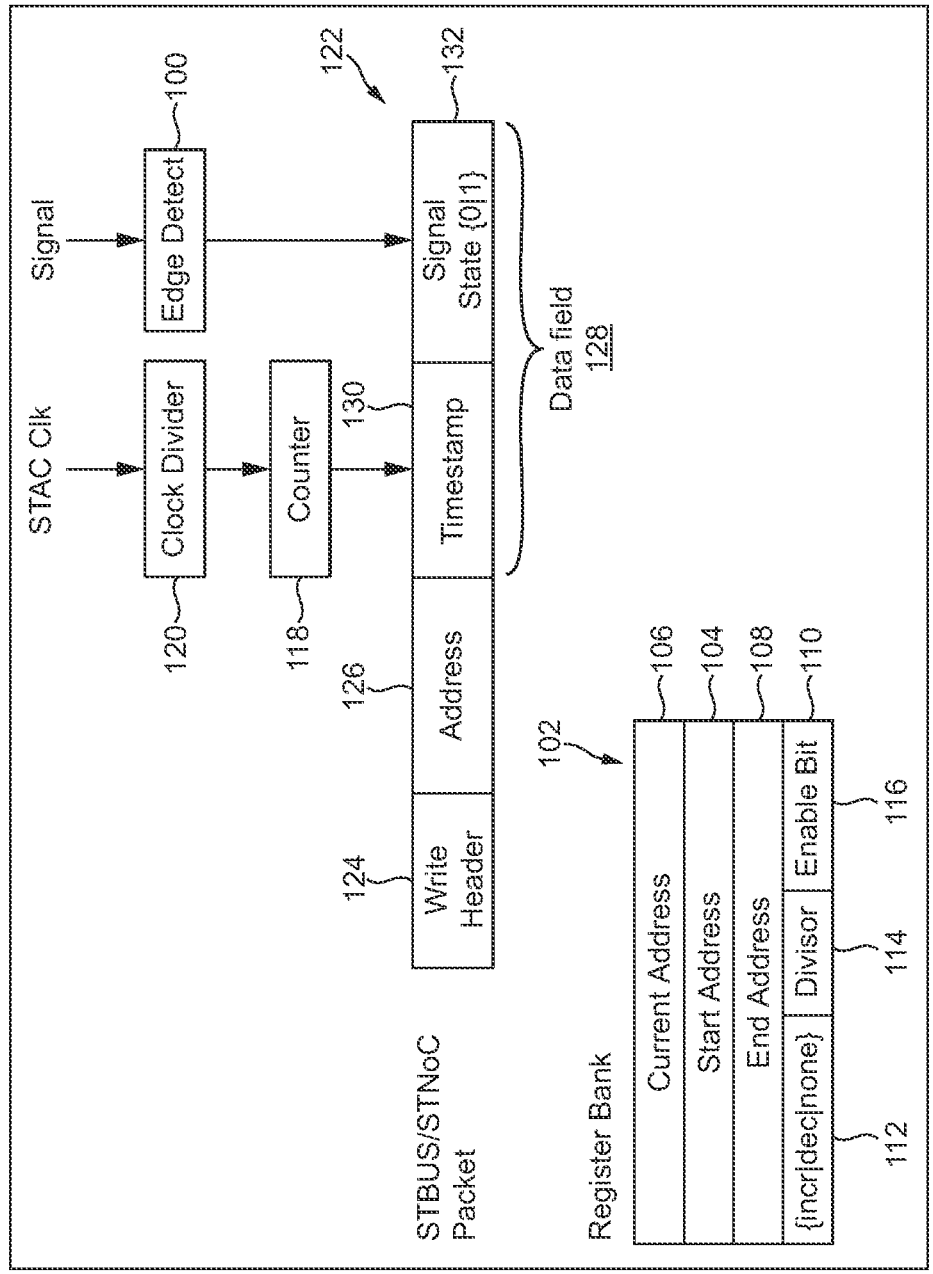
FIG. 9 schematically shows elements of the hardware required to implement edge triggered encoding of write messages.

In this regard, reference is made to FIG. 9 which shows the circuitry required to implement edge triggered encoding of write messages on the interface, on the transmitting die. A register bank 102 is provided. The register bank 102 is configured to hold information which needs to be configured by software before the circuitry can be used. The register bank comprises a start address register 104 which specifies the address to which the first such write transaction is to be sent. An end register 108 specifies the last address to which the write transaction will be sent. The start register 104 and end register 108 between them demarcate the buffer area in memory (or register space) to which the messages may be sent. The register also comprises the current address register 106 which has the address to which the next write transaction is to be sent or contains the address to which the last transaction was sent.

A configuration register 110 is also provided. The configuration register comprises three fields. The first field 112 indicates the increment mode of the current address register. Either the address is incremented by for example one unit, for example by a word (4 bytes) on each message or the address is decremented by for example one unit on each message. When the current address in the current address register 106 reaches the value in the end address register, the next address will be the start address again. In this way, a circular buffer may be defined. A third option in the first field 112 is "none" which indicates that all messages will be transmitted to the same address. In other words, the field indicates if the current address register is to be incremented, decremented or always transmitted to the same address.

The second field 114 is the divisor field which indicates by how much the clock is divided in order to produce the time stamp. As can be seen from FIG. 9, a counter 118 receives an input from a clock divider 120. The clock divider 120 receives the clock. The input clock is divided by the clock divider 120 which controls the counter 110. The divisor field thus indicates by how much the clock has been divided by in the counter which produces the time stamp. This is to prevent the time stamp overflowing in too short a time and also sets a position of the time stamp.

The final field is the enable bit field 116 which indicates whether this mechanism is enabled to send packets on the interface.

In this scenario, interrupts and/or edge encoded signals are carried by the write transactions between the two dies within the single package. The write transactions are arranged to target memory or registers, for example in an interrupt controller.

When an edge detect block 100 senses a transition on an incoming signal, which may be an interrupt, handshake, pacing signal, etc, it causes the construction of the packet 112 shown in FIG. 9. This packet comprises four fields. The first field 124 is a write header which specifies that the packet is a write word transaction, for example a store of 4 bytes. The header may also contain transaction identification, security credentials, transmission priorities, cacheability, mergeability, write-portability, bufferability and/or other advice to the interconnect. The primary purpose of the write header in one embodiment is to identify the packet meaning to implement a word write to a selected address.

The second field 126 is the address. This specifies the word address to which the data is to be written. This also implies that the least significant 2 bits are unused. In the example the unit is a 4 byte word. As the smallest increment in the address is four in binary form this means that the least significant 2 bits are not required since they cover the range 0, 1, 2, 3.

The third field 128 is the data field which comprises two fields. The first sub-field 130 is the time stamp field which contains the value of the counter at the time that the edge was detected. The counter increments at a rate determined by the divisor divided clock. As mentioned previously, the divisor is programmable so that the time stamp precision and rate of wrap around of the counter can be controlled. The counter can be any suitable size but in one embodiment of the invention may be 31 bits.

The second sub-field of the data field is the signal state sub-field 132 which indicates whether the packet was generated on a falling transition or a rising transition. By way of example, the falling transition may be indicated by value 0 while the rising transition may be indicated by value 1. However, in alternative embodiments of the invention, the falling transition may be indicated by value 1 and the rising transition by value 0.

The address field is calculated from the four registers in the configuration register bank 102. The first packet will use the address specified in the start address register 104. Subsequent addresses will depend on the value contained in the addressing mode field 112. As mentioned previously, this will specify whether subsequent addresses are incremented by a word, decremented by a word or not incremented at all. The current address, that is the address which will be used by the next packet and included in current address field 106, will reflect this mode. For example, if the addressing mode field 112 specifies that the address is to be either incremented or decremented, this will continue until the current address equals the end address specified in the end address register 108.

When this occurs, the next address will be the start address. This is arranged to implement a wrap around in the sequence of addresses and ensures that the mechanism only writes within a prescribed area. This mechanism can be used as an alternative or in combination with the bundle width conduits described previously in order to support interrupts.

If the address specifies an area of RAM (random access memory) then it can be seen that the signal wave form can be repeated from the samples in the RAM. Therefore, an interrupt service routine (ISR) is able to decode and service a sequence of edge triggered interrupts. In other words and interrupt assert or de-assert may be determined from the information included in a plurality of the packets.

The address may also specify a register, e.g. a door bell or a FIFO implemented hardware. This may be an application where a no increment addressing mode may be appropriate.

The address is preferably in a shared memory such as a RAM. The RAM is used by at least one other function or application. The shared memory may be a general data buffer usable by a CPU.

Any suitable mechanism can be used to trigger the CPU read the data in the memory. For example the CPU may be arranged to periodically read the memory. The CPU may be triggered to read the memory after the receipt of every n packets where n is greater than or equal to 1. The transmitting die may be arranged to transmit an interrupt information signal via the bundle mechanism which triggers the CPU to read the memory. The interrupt information signal can be in the form of level type signal.

Figure 15:
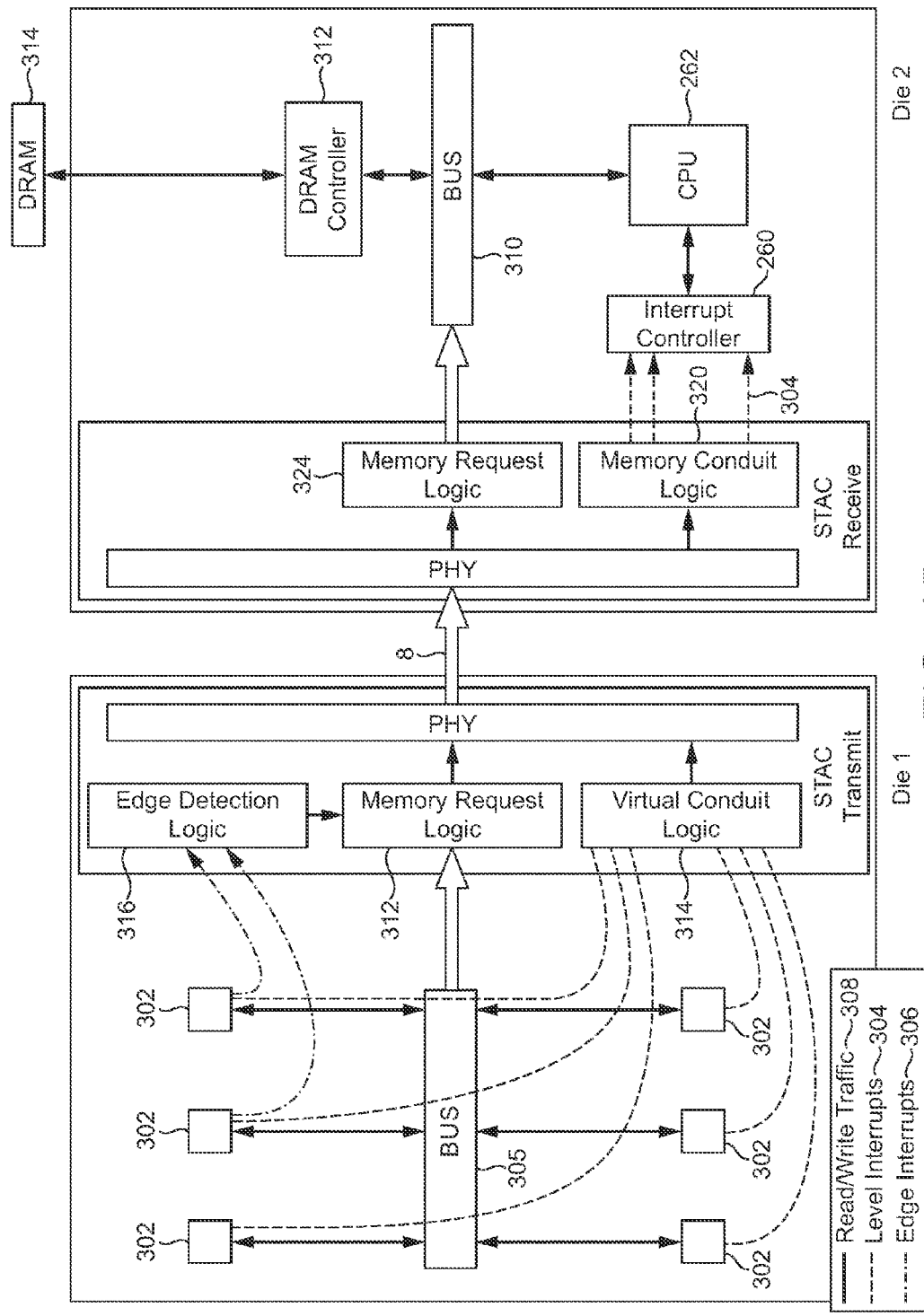
FIG. 15 schematically illustrated the circuitry for edge triggered interrupts.

Reference is made to FIG. 15. On a first one of the dies 2 is provided a bus 300 to which a plurality of functions (which may comprise the requesters of FIG. 10) 302 are connected. These functions may be memory transaction provider and/or receivers. The functions 302 provide read/write traffic 308 which is put onto the bus 300. The traffic is put onto the interface 8 using the memory transaction logic as described previously and represented diagrammatically by reference 312. Any level interrupts 304 generated by the functions 302 are put onto the interface using the bundle logic as described previously and represented diagrammatically by reference 314. Any edge interrupts 306 generated by the functions 302 are put onto the interface using the logic as described previously and represented diagrammatically by reference 316.

On the second of the dies 4 is provided corresponding bundle logic as previously described and represented diagrammatically by reference 320. This logic will cause the level interrupts 304 to pass to the interrupt controller 260 which issues interrupt requests to the CPU 262.

The memory requests and the packetized edge interrupts are processed by the memory transaction logic on the second die. This logic is as previously described but is referenced 324. The memory transactions and packetized edge interrupts are put onto a bus 310 which allow the edge interrupt information to be written to the address in the DRAM 314, under the control of the DMA controller 312, which is in the edge interrupt packet. This DRAM is off chip in this embodiment but in alternative embodiments the edge interrupt information may be written to a memory on chip.

The information stored in the DRAM can be read by the CPU which is able to identify if an interrupt is being asserted/de-asserted.

In those embodiments where the above arrangement is used in conjunction with a sampled bundle mechanism, it may then be possible to set the sample rate to a slower value. This represents the frequency of the bursts rather than the high frequency of edge transitions within the burst which would generate traditional interrupts. The record of transitions within a burst can be retrieved from RAM using this mechanism.

In the alternative, a single register bank shared amongst all the interrupts which use this mechanism may be provided. In this example, the write operand may be larger, for example 64 bits, with an additional interrupt identifier. The interrupt identifier may be provided by 32 bits. It should be appreciated that the particular examples of the size of the fields in terms of bits is by way of example and alternative embodiments of the present invention may use different bit sizes for the field. In this example where there is a single register bank, there may be a single circular buffer in memory containing transition samples from all such interrupts but each transition would be marked explicitly as to which interrupt it belonged.

In the earlier described embodiment, there may be a separate circular buffer for each interrupt so the identity of the sample would be determined by the address, that is, the buffer of which it is a member.

In one modification, the dies and the interface are configured to treat the edge-triggered interrupts in the same way as level sensitive interrupts. In some embodiments it may be necessary to use a relatively high sampling rate in order to minimize the potential for missing an edge. In yet another embodiment of the invention, activation based sampling for edge triggered interrupts may be used.

The following embodiment may be used with any traffic packets on the interface.

One modification to the presently described embodiments will now be described with reference to FIG. 10. Meeting quality of service commitments may be power inefficient as it is often the case that over provisioning of the resource sufficient to cover unknown situations is generally used. However, the embodiment shown on FIG. 10 may, in some situations, be able to minimize the power cost of the transmission while still supporting end to end quality of service commitments. In this embodiment, software in a traffic requirement block 141 declares traffic requirements, i.e. flow for the stream from each memory transaction requestor 140 by writing the required parameters into configuration registers 142 in a respective traffic control block 145.

In this example each memory transaction requester is provided with a configuration register. In one embodiment a configuration register is associated with a single requestor. In an alternative embodiment, a configuration register can be associated with two or more requestors. In some embodiments of the invention, the number of requestors associated with a given register may be different for different registers. The number of requestors in this alternative may vary from 1 to a plurality of requestors. Alternatively or additionally this same technique can be used to deal with the bundles.

One control block 145 may be associated with a single register or may be provided with a plurality of registers. In one embodiment, a single control block may be provided which is associated with all of the registers.

The or each control block 145 has a queue controller 143 which converts the configuration information from each configuration register into priority, interface speed and number of lanes and connects a particular wire to a particular queue 132-138 in order to minimize power consumption. A lane is considered to be a subset of the wires or connectors of the interface 8. In one embodiment, this is done dynamically and is reevaluated periodically. The arbiter module 130 is arranged to monitor packets entering the queue and the wait time of each packet before scheduling the transmission of packets across the interface.

Figure 10:
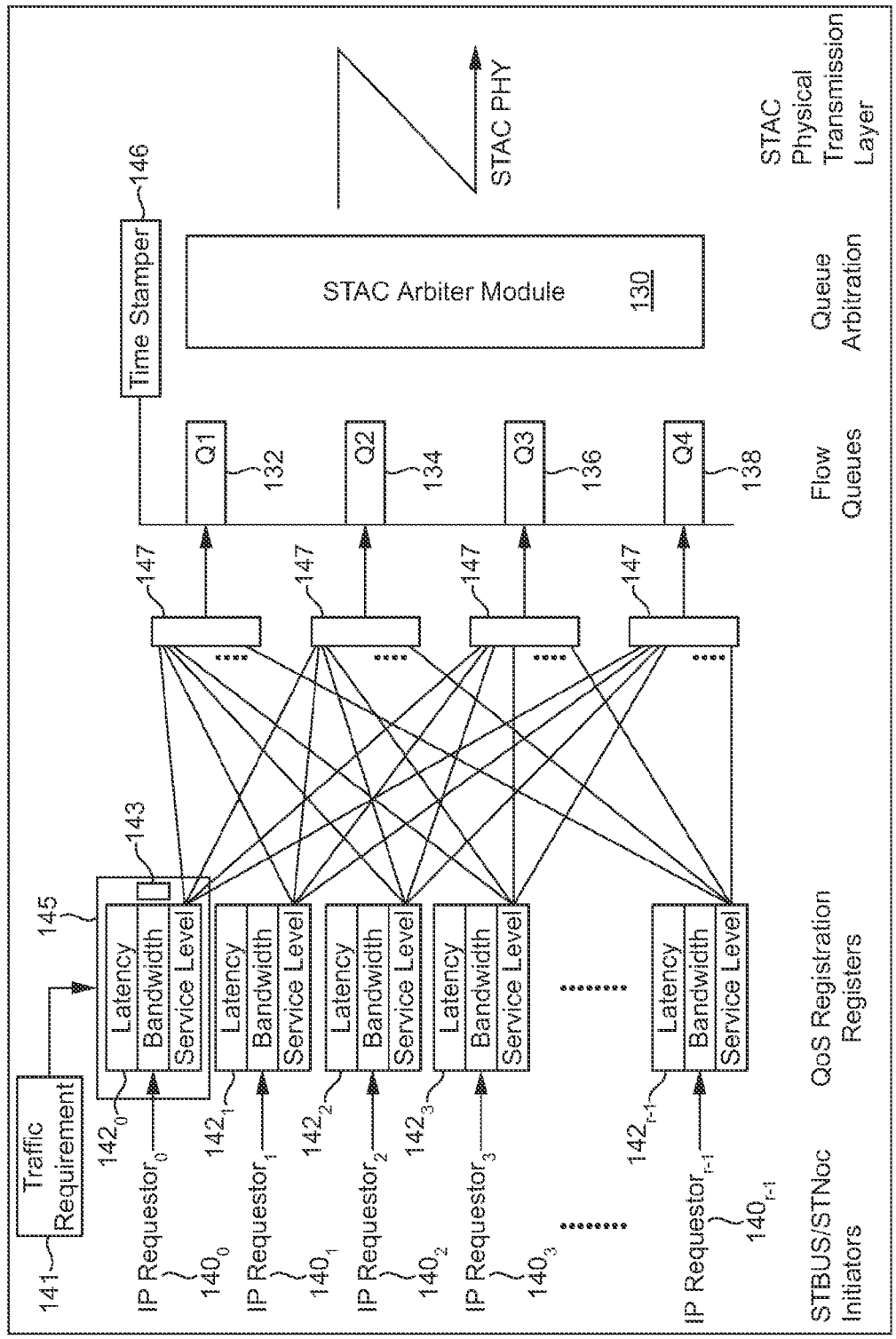
FIG. 10 schematically shows circuitry for controlling traffic flows from one die to the other.

As shown in FIG. 10, an arbiter module 130 is provided. The arbiter module is arranged to receive inputs from four queues, 132, 134, 136 and 138. In this embodiment, four queues are provided. However, this is by way of example only and more or less than four queues may be provided.

The first queue 132 represents the queue for best effort and low bandwidth. The second queue 134 is for best effort and high bandwidth. The third queue 136 is for low latency and slow bandwidth while the fourth queue 138 is for low latency and high bandwidth. It is guaranteed that the latency requirements of the third and fourth queues 136 and 138 will be met, for example for real time requirements. In contrast, the first and second queues 132 and 134 are such that there is a lesser latency commitment in that the interface will attempt but not necessarily meet their latency requirement. The four queues effectively specify four different levels of service. It should be appreciated that the characteristics of the different queues may be set up in a different way to that described. In one embodiment, responses to memory requests which are travelling in the same direction may be taken into account, since transactions and responses may share the same link.

As shown, there are R requesters 140. Memory transactions, such as read and writes, are issued by the respective requesters 140. Each requester 140 is associated with one of the configuration registers 142. Each configuration register comprises quality of service information such as latency, bandwidth (peak and/or average) and level of service required by that requester's memory traffic. In an alternative embodiment, different quality of service information may additionally or alternatively be used. In an alternative embodiment of the invention, fewer than three parameters may be used, either two or one parameter(s). In another embodiment, more than three parameters may be used.

Depending on whether the bandwidth is registered as high or low and whether the requester 140 is registered as requiring a guarantee of latency or is satisfied with the delivery on best effort basis, the transactions will be forwarded to one of the queues.

The output of each traffic control block 145 is output to each of four multiplexers 147. The multiplexers 147 are each associated with one of the queues. The multiplexers 147 allow the output of each of the traffic control blocks to be put into the queue with which the respective multiplexer is associated. The queues 132 may be implemented by a respective buffer.

Based on the quality of service factors, the arbiter module 130 will select which memory transaction formatted as a packet is to be transmitted at a particular instance to the other die. At the other die, the reconstituted packets will be transmitted on the internal bus network and/or chip network using appropriate quality of service. The arbiter module 130 will provide the clock rate and the number of physical connection lanes used in accordance with the registered traffic flows. This information is sent across the interface or received from the other die so that the two die will work in the same way.

Thus, the software 141 makes sure that the appropriate values are in the appropriate register 142 for that requester. It should be appreciated that this software may be shared by two or more requesters. Alternatively or additionally one or more requestors may each have their own software which causes the appropriate values to be put in the appropriate registers. The software 141 will provide the performance characteristics that the requester is required to register a traffic flow. As mentioned previously, this requires a specification of the latency required for memory accesses, for example the maximum permitted number of clock cycles it takes from the request to the completion of the memory in response. Additionally or alternatively, the bandwidth may be specified, that is the peak bandwidth and/or the average bandwidth. The average bandwidth can be considered to be the arithmetic mean bandwidth over the period when the device is enabled for the duration of the current use case. It should be appreciated that the performance characteristic may be a single defined characteristic in alternative embodiments of the invention. The one or more quality of service requirements may include additional or alternative quality of service parameters to those discussed above. These quality of service parameters may include one or more of delay; jitter; guaranteed delivery; delivery order; and error.

The arbiter 130 is configured to use the aggregate average bandwidth from all of the register traffic flows to provide the clock rate and the number of lanes in use. The clock rate may be adjustable as may be the lanes. (Lanes are the logical name for the physical links between the dies. A lane may comprise one or more wire, for example.) For example, in one simple implementation, the clock rate may be adjustable between 1 MHz and 400 MHz. The number of lanes may be 1 (of 8 bits) or 2 lanes of 8 bits each. This would mean that the capacity of the link is from 16 Mbits/sec to 12.5 Gbits/sec. In one embodiment, the interface is able to use single clock edge. One, high speed, operating mode would be have the data on the lanes change on both the rising edge of the associated clock and the falling edge—referred to as dual clock edge; a slower, lower power mode would be to change data on only the rising edge. This assumes that the physical link has a physical clock associated with it. However, there are other techniques which can be used with embodiments of the invention, which do not use a clock, e.g. asynchronous transmission which may make the range from 8 Mbits/seconds to 12.5 Gbits/seconds. It should be appreciated that the number of lanes and the clock rate can be varied from implementation to implementation. In some embodiments of the present invention, one or both of the number of lanes and clock rates may be changed.

In operation, a memory transaction from the requester is directed at the appropriate queue determined by the registered level of service stored in the appropriate register. Each packet is stamped by time stamper 146 with an indication of when it entered the queue so that the arbiter 130 is able to tell how long the packet has been queued. The priority of transmission will be in order of latency requirement. Thus, those having the tightest deadlines will be scheduled first. The deadline may be defined as mean time before the latency requirement expires.

The arbiter module is arranged to continually monitor the length of all four queues to determine the clock rate and lane provision. In one embodiment of the present invention, this monitoring may occur once every one microsecond. However, this monitoring may be different in different embodiments of the present invention. In one embodiment of the present invention, the frequency of monitoring may be changed depending on the operating conditions of the chip.

When the operation mode of a particular requester changes, the values associated with that request can be changed in the register. For example, if the bandwidth parameter is set to 0, this will indicate that the particular requester has entered a low power mode.

This embodiment has been described in relation to memory transaction packets. However, this technique can be applied as well to the bundles. The bundles would have a quality of service values stored in one or more registers. The values may be the bundle enable bits and sample rate from which the amount of bandwidth required can be determined. The bundles may have their own queues (as previously described) or share one or more memory transaction queues.

Figure 13:
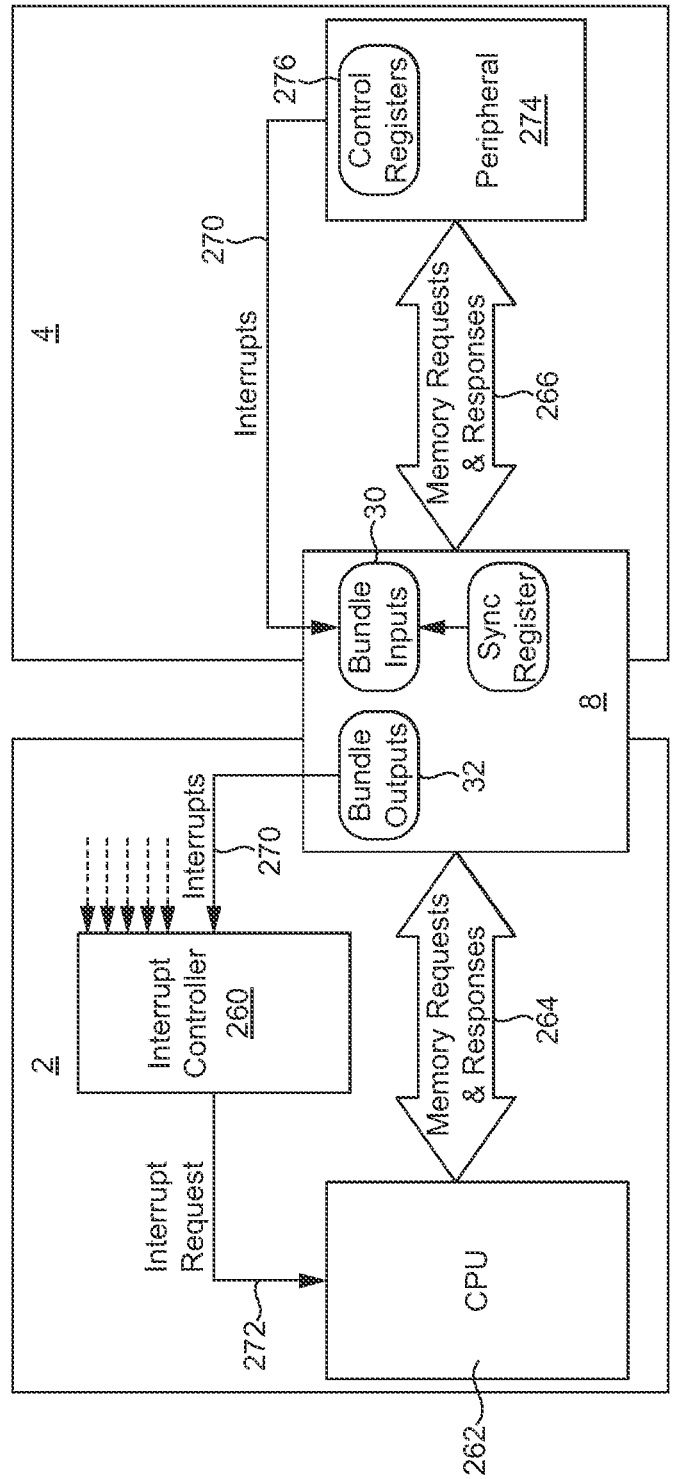
FIG. 13 schematically shows interrupt circuitry.

Reference is made to FIG. 13 which schematically shows interrupt circuitry. It should be appreciated that this circuitry can be used for level sensitive interrupts and/or edge sensitive interrupts. One of the dies 4 is provided with a peripheral device 274 having a control register 276. The peripheral device 274 may provide an interrupt signal 270. The interrupt signal may be the assertion or de-assertion of the interrupt signal. The interrupt may be a level sensitive interrupt or an edge sensitive interrupt. It should be appreciated that in practice the die would have a plurality of functional blocks or the like which generate interrupts. The interrupt signal 270 is provided on a dedicated wire which is input to one of the bundles 30. The value of the interrupt signal 270 is controlled by the value in the control register 276.

The peripheral device 274 may be configured to provide memory transactions and/or to receive memory transactions via connection 266. Connection 266 is provided to the interface 8. As discussed previously, the interrupt signal in one of the bundle packets and the memory transactions packets are transmitted/received across the interface in a multiplexed fashion.

At the other die 2, the bundle 32 is divided up and the interrupt signal 270 is input to an interrupt controller 260. The interrupt controller 260 is configured to generate an interrupt request 272 to the CPU 262. The CPU is configured to provide and/or receive memory transactions to/from the interface 8.

Figure 11:
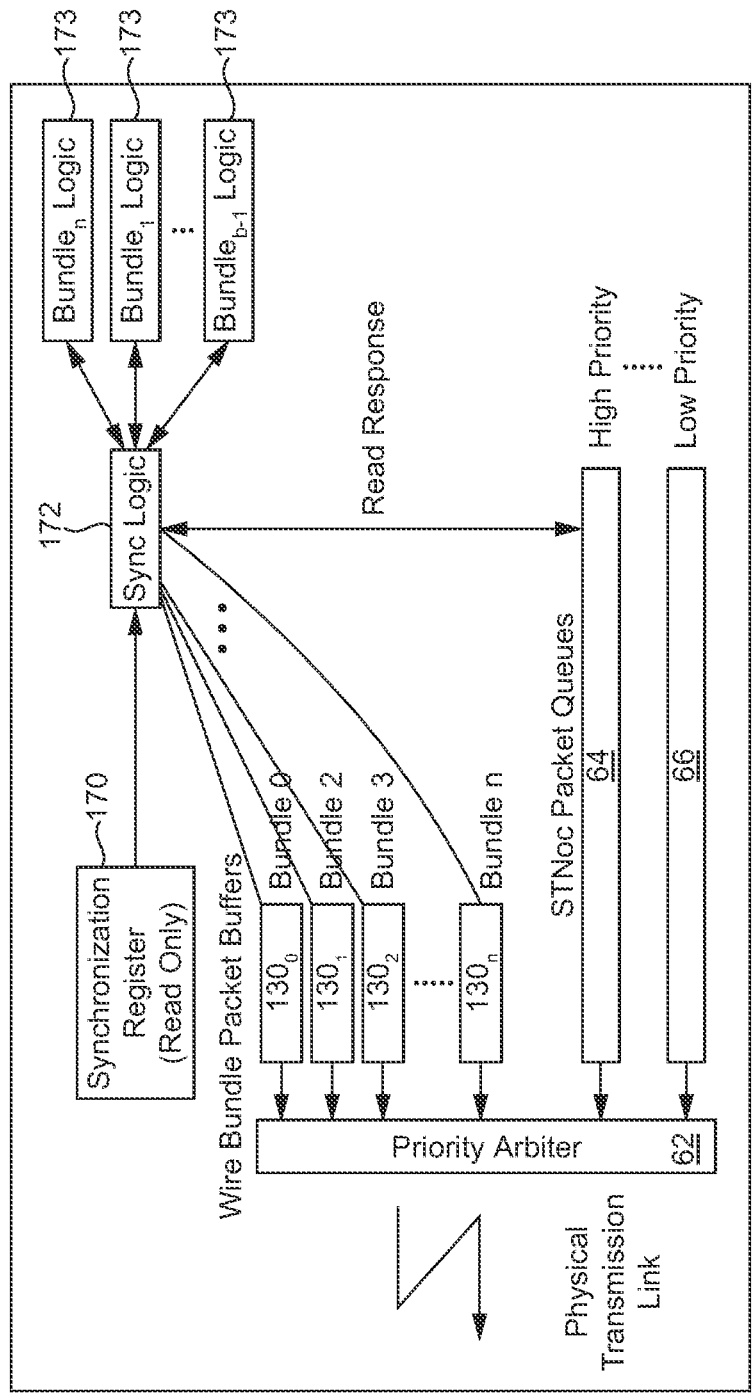
FIG. 11 schematically shows a synchronization mechanism.

In a further embodiment of the present invention, a synchronization register 170, as shown in FIG. 11 is provided. This register can also be seen in FIG. 13. This synchronization register 170 is able to address the possibility of race hazard existing between the software reading a register in a functional module to determine the modules interrupt state and the propagation of the virtual conduit (that is the interface) state carrying related interrupt signals to the CPU. In particular, a module may assert an interrupt and a CPU may receive that interrupt and subsequently process the interrupt using an interrupt service routine. One of the final activities of servicing the interrupt may be to notify the module that the CPU has removed the interrupt condition and that the module is ordered to de-assert its interrupt signal by clearing some status bits in one of the module's register.

Embodiments of the present invention are able to address the issue that there is often a time lag between the condition being cleared in the module's register and the related signal de-assertion propagating back to the CPUs interrupt controller.

In some embodiments of the present invention, a read to the synchronization register 170 will force all bundle sample periods to be brought forward to the next clock cycle and the register will not return a value to the read request until all wire packets which are due to be transmitted have completed their transmission.

A read to the synchronization register has the effect of flushing all pending signal activity out of the bundles and flushing the bundles across the interface. Thus, in some embodiments of the invention, the register may be used by the software to guarantee the ordering of certain events. The register 170 may be used to guarantee that any delay in a service interrupt signal transmission across the interface can be dealt with by an interrupt service routine.

In one further modification, this mechanism may also be used to support low power modes by stopping the sampling of the bundles and moving this function into software which, by use of the synchronization register can schedule an update of the interrupt signals. This lets the generation of the bundles only happen under software control, rather than whenever a change is detected by the hardware. This could lead to a power saving if the real time state of the wires in the bundles is not required during that operating mode.

In more detail, FIG. 11 shows a synchronization register 170. The synchronization register 170 is a read-only register in the die which may be read by software running on a CPU. As can be seen from 13, the synchronization register is on the same die as the module asserting the interrupt. When the register 170 is read it signals a synchronization logic block 172. The synchronization logic block 172 sends signals to each of the bundle control logic 173. The bundle control logic may comprise the circuitry of FIG. 5. The bundle control logic is configured to ensure that all bundle registers 31 are sampled immediately and any pending bundle updates are sent to the bundle 30 which are implemented as buffers. In FIG. 11, the bundles and bundle registers are marked by reference 130 but they have the general structure illustrated in FIG. 2.

The wire bundle control logic 173 signals to the synchronization logic block when all the pending transmissions of the bundles have been completed. Only after these confirmations does the synchronization logic block 172 format a read response to the synchronization register read request. The read response is transmitted back to the CPU to as normal.

Reference is made to FIG. 5, the function of which is modified in order to allow the synchronization logic block to function. The logic determining when and how samples are generated are modified such that if a bundle receives a signal from the synchronization logic block 172 and it has been configured as a sample bundle, it will generate a sample immediately. A check is made to see if this sample requires transmission, in other words is the values on any one of the wires different from the previously transmitted signal values of that bundle. In particular, the arrangement of FIG. 5 is modified so that the multiplexer receives a control signal from the synchronization logic block. Accordingly, the multiplexer is controlled such that if the counter equals 0 or the synchronization logic signal has been asserted and the bundle samples have not equaled a previous bundle sample, then the packet will be output by the packet formatter 50. The synchronization register is connected to all input bundles on that die.

In this modification, the synchronization register 170 provides the software interface to provide this function and the logic block 172 choreographs logic activities necessary to execute the function.

A read of the synchronization register 170 causes the synchronization logic block 172 to start its state machine. The synchronization logic block will assert a signal to each of the bundle control logic 173 which controls the bundles to generate a sample on the next clock cycle and to transmit that packet if it meets the other criteria for being sent. The synchronization logic block 172 then gets confirmation from the control logic 173 when the bundle packets have been dispatched for bundle packets which were either pending previously or have just been generated due to the effect of the synchronization logic block signal. The confirmation signals that all signal changes present before the synchronization register was written will have been transmitted across the interface. Subsequent to this transmission, the synchronization logic block synthesizes a response to the read synchronization register. The synchronization function does not depend on the value sent back. However in some embodiments of the present invention the synchronization function may be used to add additional information in the value returned such as if the synchronization caused any packets to be flushed out or the number of such flushed packets. This information may be used for tuning the system and/or debugging. A response packet is queued and dispatched across the interface in the same manner as a bundle packet or a memory transaction packet.

It should be appreciated that since this response is carried on the same link as the bundles, the bundles will have been updated by the time the response is received by software. In one alternative embodiment of the invention, a special type of packet recognized by a synchronization mechanism as commencing the synchronization procedure may be provided. This special type of packet may be generated either by a read from a register on the initiator die or by linking to a special barrier instruction in the CPU.

It should be appreciated that the orientation of the respective dies with respect to the substrates can be changed as compared to the flip chip orientation shown in FIG. 1*b*.

In alternative embodiments of the invention, the dies may be arranged in a stacked arrangement, one above the other.

The interface between the two dies is described in preferred embodiments of the invention as being a wired interface, that is, provided by a series of wired or wire patterned connections. In alternative embodiments of the invention, the interface may be provided by any suitable means for example an optical interface or a wireless interface.

For clarity a number of the embodiments described show one of the dies as transmitting to the other die which receives the signals. It should be appreciated that in some embodiments of the invention both dies may have the "transmitting" part of the circuitry and the "receiving" part of the circuitry so that the interface is bi-directional. It should be appreciated that in some embodiments at least some of the wires or other interface mechanism are bidirectional. In alternative embodiments the interface may comprise two separate paths, on path for received packets and the other path for transmitted packets.

What is claimed is:

1. A package, comprising:
A first die;
a second die; and
an interface connecting said first die and said second die, at least one of said first and second dies, wherein the interface comprises a substrate structure comprising:
a plurality of signal sources, each of said signal sources configured to have at least one signal source quality of service parameter associated therewith,
a plurality of queues, said queues configured to have a different priorities; and
an allocator configured to allocate a signal from a respective one of said signal sources to one of said plurality of queues in dependence on the at least one signal source quality of service parameter;
wherein the interface is configured such that signals from said queues are transported from one of said first and second dies to the other of said first and second dies.

2. The package as claimed in claim 1, wherein said at least one of said first and second dies further comprise an arbiter configured to arbitrate between said queues.

3. The package as claimed in claim 1, further comprising a controller configured to control the number of queues.

4. The package as claimed in claim 1, further comprising a controller configured to control a clock rate.

5. The package as claimed in claim 1, wherein said at least one signal source quality of service parameter comprises at least one of:
latency;
average bandwidth;
peak bandwidth;
level of service;
priority information;
sampling rate information;
delay;
jitter;
guaranteed delivery;
delivery order; and
error.

6. The package as claimed in claim 1, wherein the plurality of said queues have different latency and/or different bandwidths.

7. The package as claimed in claim 1, further comprising a time stamper configured to provide time information indicative of when a signal entered a respective queue.

8. The package as claimed in claim 1, wherein said signal sources are configured to provide memory transactions.

9. The package as claimed in claim 1, further comprising a bundler configured to bundle together a plurality of control signals to form a group, a plurality of groups being provided by said bundler.

10. The package as claimed in claim 4, further comprising a determinator configured to determine an amount of traffic on said interface and control said controller in dependence on the determined amount of traffic.

11. The package as claimed in claim 10, wherein said determinator is further configured to determine an average bandwidth.

12. The package as claimed in claim 1, wherein said controller is configred to change the clock rate in response to a determination by said determinator that said determined amount of traffic has changed.

13. The package as claimed in claim 8, wherein said interface is configured to transport both memory transactions and control signals.

14. The package as claimed in claim 9, wherein said allocator is configured to allocated said groups to one of a plurality of queues in dependence on the at least one signal source quality of service parameter associated with said group.

15. A die for use in a package, comprising said die and at least one further die, sold die comprising:
- a plurality of signal sources, each of said signal sources configured to have at least one signal source quality of service parameter associated therewith;
- a plurality of queues, said queues configured to have a different priorities;
- an allocator configured to allocate a signal from a respective one of said signal sources to one of said plurality of queues in dependence on the at least one signal source quality of service parameter; and
- an interface between said die and said further die wherein the interface is configured such that signals from said queues are transported from said dies to the further die, wherein the interface comprises a substrate structure.

16. The die as claimed in claim 15, further comprising sa controller configured to control a clock rate.

17. The die as claimed in claim 15, further comprising a bundler configured to bundle together a plurality of control signals to form a group.

18. The die as claimed in claim 16, further comprising a determinator configured to determine an amount of traffic on said interface and control said controller in dependence on the determined amount of traffic.

19. The die as claimed in claim 18, wherein said controller is configured to change the clock rate in response to a determination by said determinator that said determined amount of traffic has changed.

20. The die as claimed in claim 17, wherein said allocator is configured to allocated said group to one of a plurality of queues in dependence on the at least one signal source quality of service parameter associated with said group.

21. A method for use in a package, comprising a first die and a second die, said method comprising:
- providing a plurality of signal sources, each of said signal sources having at least one signal source quality of service parameter associated therewith;
- providing a plurality of queues, said queues having different priorities;
- allocating a signal from a respective one of said signal sources to one of said plurality of queues in dependence on the at least one signal source quality of service parameter; and transporting said signals from said queues across an interface, between said first and second dies, wherein the interface comprises a substrate structure.

22. The method as claimed in claim 21, further comprising a controlling a clock rate.

23. The method as claimed in claim 21, further comprising bundling together a plurality of control signals to form a group.

24. The method as claimed in claim 22, further comprising determining an amount of traffic on said interface and controlling the clock rate in dependence on the determined amount of traffic.

25. The method as claimed in claim 24, further comprising changing the clock rate in response to a determination that said determined amount of traffic has changed.

26. The method as claimed in claim 23, wherein allocating comprises allocating said group to one of a plurality of queues in dependence on the at least one signal source quality of service parameter associated with said group.

* * * * *